US012075672B2

(12) United States Patent
Jin et al.

(10) Patent No.: US 12,075,672 B2
(45) Date of Patent: Aug. 27, 2024

(54) DISPLAY PANEL AND DISPLAY DEVICE

(71) Applicant: LG Display Co., Ltd., Seoul (KR)

(72) Inventors: Jungdoo Jin, Gyeonggi-do (KR);
Seonha Yu, Gyeonggi-do (KR);
Moonsun Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/188,295

(22) Filed: Mar. 22, 2023

(65) Prior Publication Data

US 2023/0309353 A1    Sep. 28, 2023

(30) Foreign Application Priority Data

Mar. 28, 2022 (KR) .................... 10-2022-0038387

(51) Int. Cl.
*G09G 3/3233* (2016.01)
*H10K 59/131* (2023.01)

(52) U.S. Cl.
CPC ......... *H10K 59/131* (2023.02); *G09G 3/3233* (2013.01); *G09G 2300/0426* (2013.01); *G09G 2300/0842* (2013.01)

(58) Field of Classification Search
CPC ............. H10K 59/131; H10K 59/1213; H10K 59/121; G09G 3/3233; G09G 2300/0426; G09G 2300/0842; G09G 3/3225; H01L 27/1214

See application file for complete search history.

(56) References Cited

U.S. PATENT DOCUMENTS

| 2018/0143473 | A1* | 5/2018 | Yamazaki | G02F 1/136286 |
| 2019/0302934 | A1* | 10/2019 | Rhe | G06F 3/047 |
| 2020/0125196 | A1* | 4/2020 | Okuno | G06F 3/044 |
| 2021/0216157 | A1* | 7/2021 | Jeong | H10K 50/82 |
| 2021/0313539 | A1* | 10/2021 | Jeon | H10K 59/353 |
| 2022/0285470 | A1* | 9/2022 | Qiu | H10K 59/1216 |
| 2022/0376029 | A1* | 11/2022 | Huang | H10K 59/131 |
| 2023/0217717 | A1* | 7/2023 | Lee | H10K 59/88 |
| | | | | 257/40 |

* cited by examiner

*Primary Examiner* — Premal R Patel
(74) *Attorney, Agent, or Firm* — Seed IP Law Group LLP

(57) ABSTRACT

The present disclosure relates to display panels and display devices that are capable of simplifying a manufacturing process and more specifically to: a display area including a first optical area including a central area and a bezel area located outside of the central area and a normal area located outside of the first optical area. A plurality of light emitting elements disposed in the central area and a plurality of light emitting elements and a plurality of transistors including a plurality of source-drain electrode patterns are disposed in the bezel area. There is a connection pattern contacting a first source-drain electrode pattern in the bezel area and extending to a portion of the central area. In one embodiment, one of the plurality of source-drain electrode patterns and the at least one connection pattern are disposed on a same layer and include different materials.

28 Claims, 16 Drawing Sheets

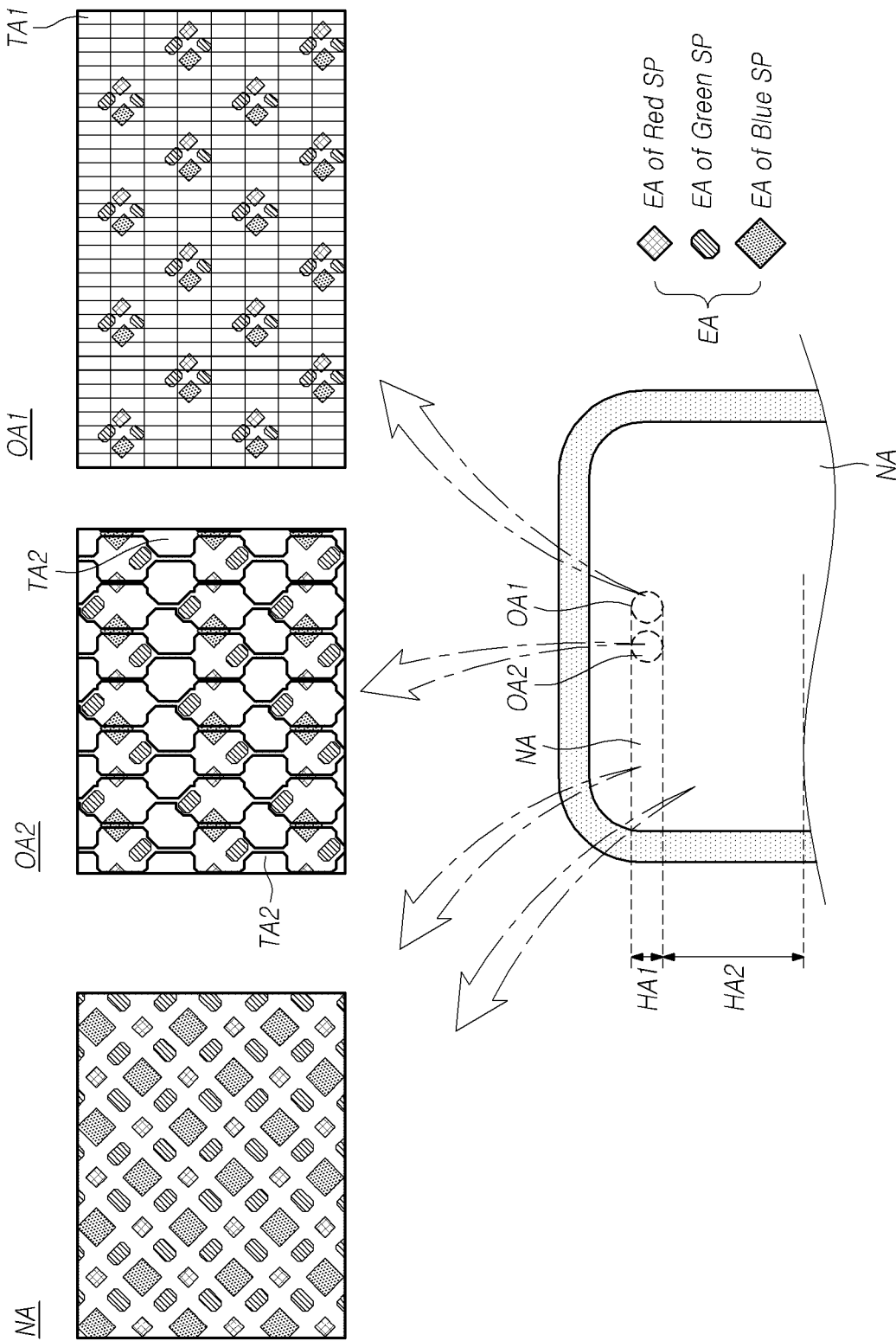

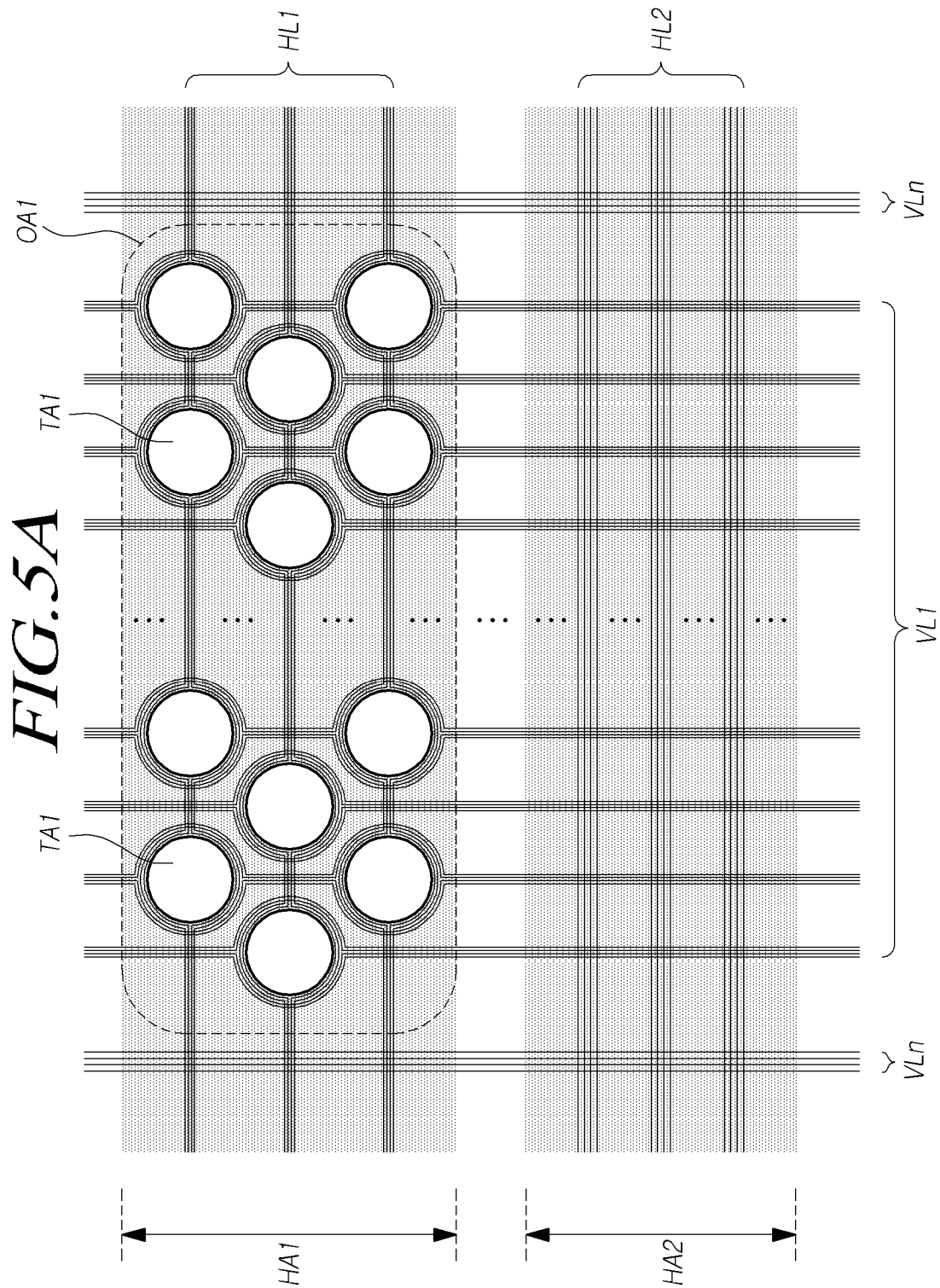

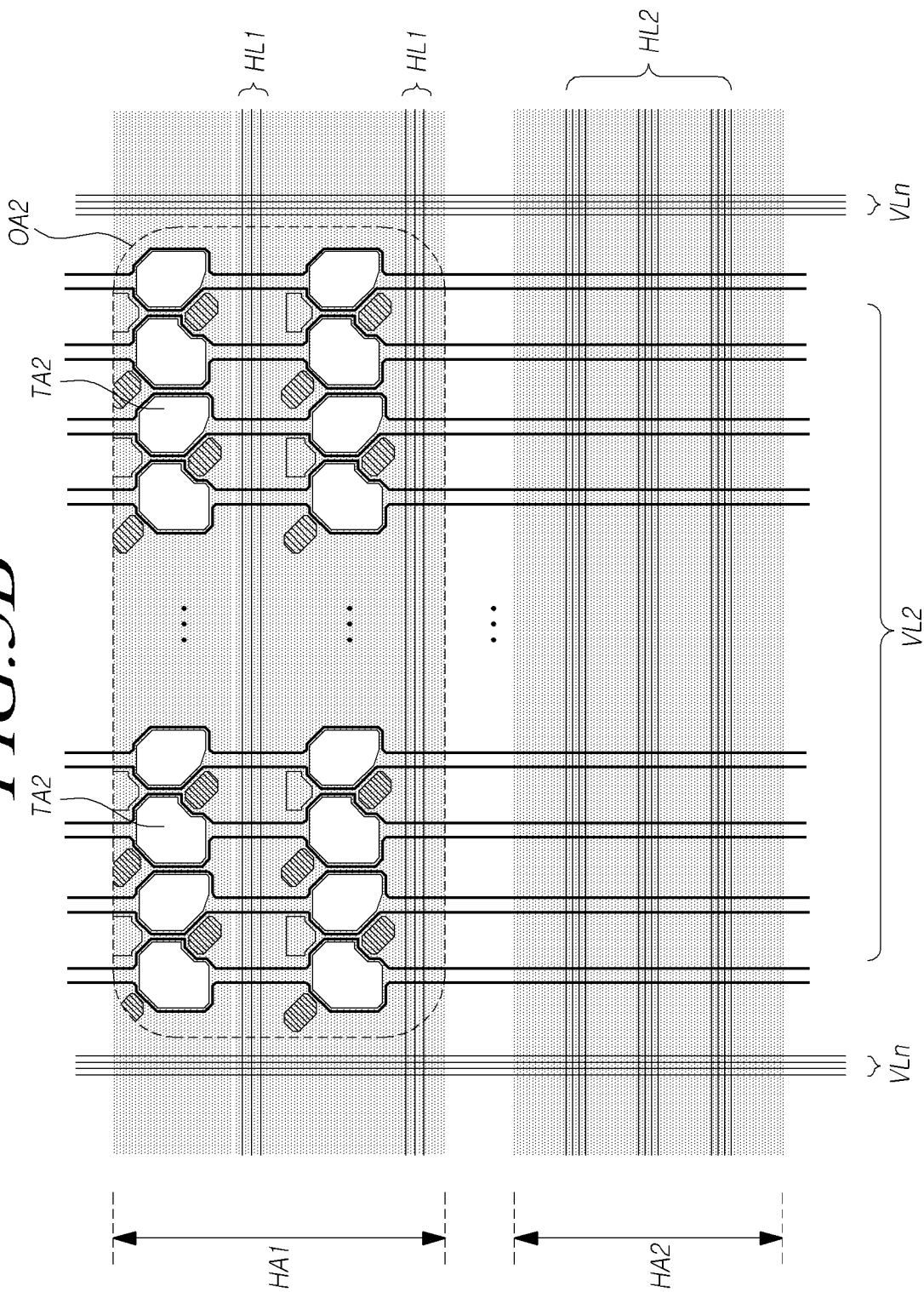

DISPLAY PANEL AND DISPLAY DEVICE

CROSS-REFERENCE TO RELATED APPLICATION

This application claims the priority benefit of Republic of Korea Patent Application No. 10-2022-0038387, filed on Mar. 28, 2022 in the Korean Intellectual Property Office, which is incorporated herein by reference in its entirety.

BACKGROUND

Technical Field

The present disclosure relates to electronic devices, and more particularly, to a display panel capable of improving transmittance of an area in which an optical device is disposed and simplify a manufacturing process, and a display device including the display panel.

Description of the Related Art

As display technology advances, display devices can provide increased functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it may be desirable for such an optical electronic device to be located in an area of the display device where incident light coming from the front surface can be increasingly received and detected. Thus, in a typical display device, an optical electronic device has been designed to be located in a front portion of the display device to allow a camera, a sensor, and/or the like as the optical electronic device to be increasingly exposed to incident light. In order to install the optical electronic device in such an implementation, a bezel area of the display device may be increased, or a notch or a hole may be formed in a display area of a display panel of the display device.

Therefore, to receive incident light, and perform an intended function, as a display device is provided with an optical electronic device such as a camera, a sensor, and/or the like, a bezel area in a front portion of the display device may be increased, or a substantial disadvantage may be encountered in designing a front portion of the display device.

BRIEF SUMMARY

The inventors have developed techniques for providing or placing one or more optical electronic devices in a display device without reducing an area of a display area of a display panel of the display device. Through the development, the inventors have invented a display panel and a display device that have a light transmission structure in which even when an optical electronic device is located under a display area of the display panel and is therefore not exposed in a front surface of the display device, the optical electronic device can normally and increasingly receive and detect light.

Further, the inventors have invented a display panel and a display device that have a structure in which an area where an optical electronic device is disposed is configured to have a high transmittance.

One or more example embodiments of the present disclosure may provide a display panel and a display device that are capable of reducing a non-display area of the display panel and enabling an optical electronic device such as a camera, a sensor, and/or the like not to be exposed in a front surface of the display panel by disposing the optical electronic device under a display area, or in a lower portion, of the display panel.

One or more example embodiments of the present disclosure may provide a display panel and a display device that have a light transmission structure for enabling an optical electronic device under a display area, or in a lower portion, of the display panel to normally receive and detect light transmitting the display panel.

One or more example embodiments of the present disclosure may provide a display panel and a display device that are capable of normally performing display driving in an optical area included in a display area of the display panel and overlapping the optical electronic device.

According to aspects of the present disclosure, a display device is provided that includes a display panel including a display area that includes a first optical area including a central area and a bezel area located in the optical area, but outside of the central area, and includes a normal area located outside of the first optical area, and a display driving circuit for driving the display panel. The display panel may include a plurality of light emitting elements disposed in the central area, a plurality of light emitting elements and a plurality of transistors including a plurality of source-drain electrode patterns, which are disposed in the bezel area, and at least one connection patterns contacting at least one of the source-drain electrode patterns in the bezel area and extending to a portion of the central area. The at least one source-drain electrode patterns and the at least one connection patterns are disposed in a same layer and include different materials.

According to aspects of the present disclosure, a display panel is provided that includes a display area including a first optical area including a central area and a bezel area located outside of the central area, and including a normal area located outside of the first optical area. The display panel may include a plurality of light emitting elements disposed in the central area, a plurality of light emitting elements and a plurality of transistors including a plurality of source-drain electrode patterns, which are disposed in the bezel area, and at least one connection patterns contacting at least one of the source-drain electrode patterns in the bezel area and extending to a portion of the central area. The at least one source-drain electrode patterns and the at least one connection patterns are disposed in a same layer and include different materials.

According to one or more example embodiments of the present disclosure, a display panel and a display device can be provided that are capable of reducing a non-display area of a display panel and enabling an optical electronic device not to be exposed in a front surface of the display panel by disposing the optical electronic device under a display area, or in a lower portion, of the display panel.

According to one or more example embodiments of the present disclosure, a display panel and a display device can be provided that are capable of improving the transmittance of a central area by disposing a plurality of transistors in a bezel area of an optical area while not disposing transistors in the central area of the optical area.

According to one or more example embodiments of the present disclosure, a display panel and a display device can be provided that are capable of reducing thicknesses thereof and simplify a manufacturing process by arranging, in a same layer, at least one source-drain electrode pattern of at least one transistor and at least one connection pattern, which include different materials and are disposed in an optical area.

According to one or more example embodiments of the present disclosure, a display panel and a display device can be provided that have a light transmission structure for enabling an optical electronic device under a display area, or in a lower portion, of the display panel to normally receive and detect light transmitting the display panel.

According to one or more example embodiments of the present disclosure, a display panel and a display device can be provided that are capable of normally performing display driving in an optical area included in a display area of the display panel and overlapping an optical electronic device.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims.

It is to be understood that both the foregoing general description and the following detailed description of the present disclosure are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 4 illustrates example arrangements of subpixels in three areas included in a display area of the display panel according to aspects of the present disclosure;

FIG. 5A illustrates example arrangements of signal lines in each of a first optical area and a normal area in the display panel according to aspects of the present disclosure;

FIG. 5B illustrates example arrangements of signal lines in each of a second optical area and the normal area in the display panel according to aspects of the present disclosure;

DETAILED DESCRIPTION

Figure 1A:
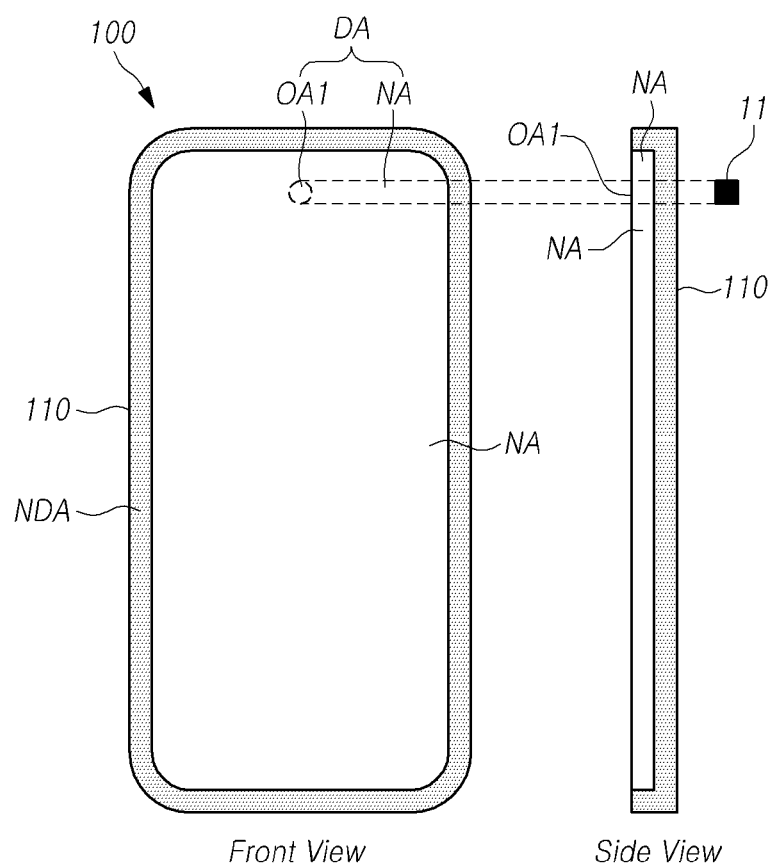
FIGS. 1A, 1B, 1C and 1D are plan views illustrating an example display device according to aspects of the present disclosure.

Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Names of the respective elements used in the following explanations are selected only for convenience of writing the specification and may thus be different from those used in actual products.

The shapes, sizes, dimensions (e.g., length, width, height, thickness, radius, diameter, area, etc.), ratios, angles, numbers, number of elements and the like, which are illustrated in the drawings to describe various example embodiments of the present disclosure are merely given by way of example. Therefore, the present disclosure is not limited to the illustrations in the drawings. Like reference numerals designate like elements throughout, unless otherwise specified.

A dimension including size and a thickness of each component illustrated in the drawing are illustrated for convenience of description, and the present disclosure is not limited to the size and the thickness of the component illustrated. However, it is to be noted that the relative dimensions including the relative size, location, and thickness of the components illustrated in various drawings submitted herewith are part of the present disclosure.

In the following description, where the detailed description of the relevant known function or configuration may unnecessarily obscure aspects of the present disclosure, a detailed description of such known function or configuration may be omitted. Where the terms "comprise," "have," "include," "contain," "constitute," and the like are used, one or more other elements may be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. Time relative terms, such as "after," "subsequent to," "next to," "before," or the like, used to describe a temporal relationship between events, operations, or the like are generally intended to include events, situations, cases, operations, or the like that do not occur consecutively unless the terms, such as "directly," "immediately," or the like, are used.

When signal flows are discussed, for example, the transmission of a signal from node A to node B may include the transmission of the signal from node A to node B by way of another node unless 'direct' or 'directly' is used.

Although the terms "first," "second," A, B, (a), (b), and the like may be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below may be a second element in a technical concept of the present disclosure.

Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, with reference to the accompanying drawings, various embodiments of the present disclosure will be described in detail.

FIGS. 1A, 1B, 1C and 1D are plan views illustrating an example display device according to aspects of the present disclosure.

Referring to FIGS. 1A, 1B, 1C, and 1D, the display device 100 according to aspects of the present disclosure may include a display panel 110 for displaying images, and one or more optical electronic devices (11 and/or 12).

The display panel 110 may include a display area DA in which an image is displayed and a non-display area NDA in which an image is not displayed.

A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, 1C, and 1D, in the display device 100 according to aspects of the present disclosure, the one or more optical electronic devices (11 and/or 12) may be located under, or in a lower portion of, the display panel 110 (an opposite side to a viewing surface thereof).

Light can enter the front surface (the viewing surface) of the display panel 110, pass through the display panel 110, reach one or more optical electronic devices (11 and/or 12) located under, or in the lower portion of, the display panel 110 (the opposite side of the viewing surface).

The one or more optical electronic devices (11 and/or 12) can receive light transmitting through the display panel 110 and perform a predefined function based on the received light. For example, the one or more optical electronic devices (11 and/or 12) may include one or more of the following: an image capture device such as a camera (an image sensor), and/or the like; and a sensor such as a proximity sensor, an illuminance sensor, and/or the like.

Referring to FIGS. 1A, 1B, 1C, and 1D, in the display panel 110 according to aspects of the present disclosure, the display area DA may include one or more optical areas (OA1 and/or OA2) and a normal area NA. Herein, the term "normal area" NA is an area that while being present in the display area DA, does not overlap with one or more optical electronic devices (11 and/or 12), and may also be referred to as a non-optical area.

Referring to FIGS. 1A, 1B, 1C, and 1D, the one or more optical areas (OA1 and/or OA2) may be one or more areas at least partially overlapping the one or more optical electronic devices (11 and/or 12).

According to an example of FIG. 1A, the display area DA may include a first optical area OA1 and a normal area NA. In this example, at least a portion of the first optical area OA1 may overlap a first optical electronic device 11.

Although FIG. 1A illustrates a structure in which the first optical area OA1 has a circular shape, the shape of the first optical area OA1 according to embodiments of the present disclosure is not limited thereto.

Figure 1B:
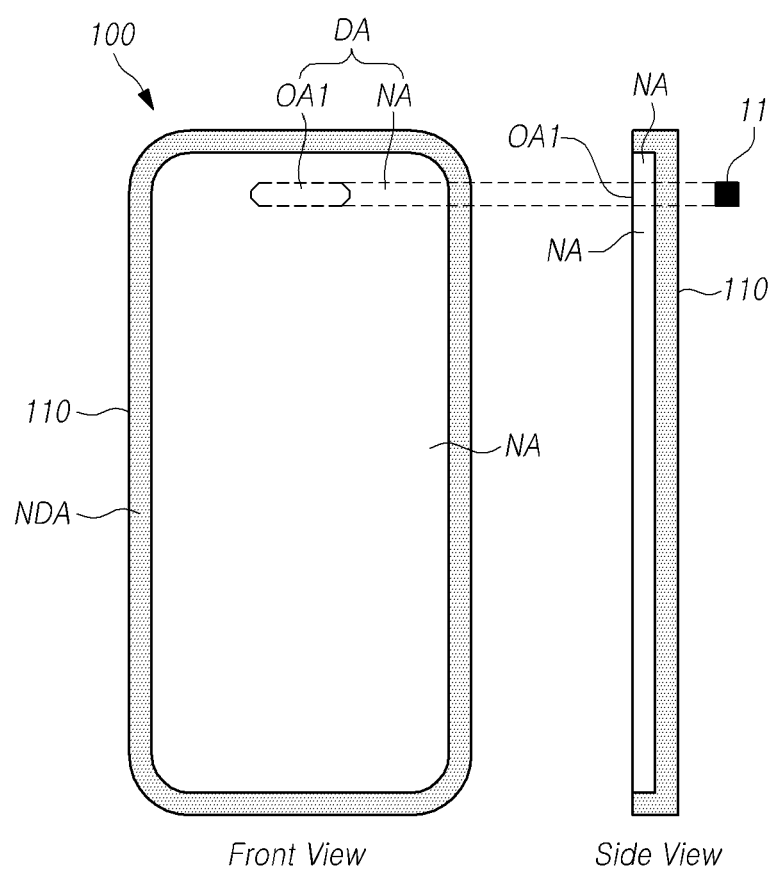

For example, as illustrated in FIG. 1B, the first optical area OA1 may have an octagonal shape, or various polygonal shapes.

Figure 1C:
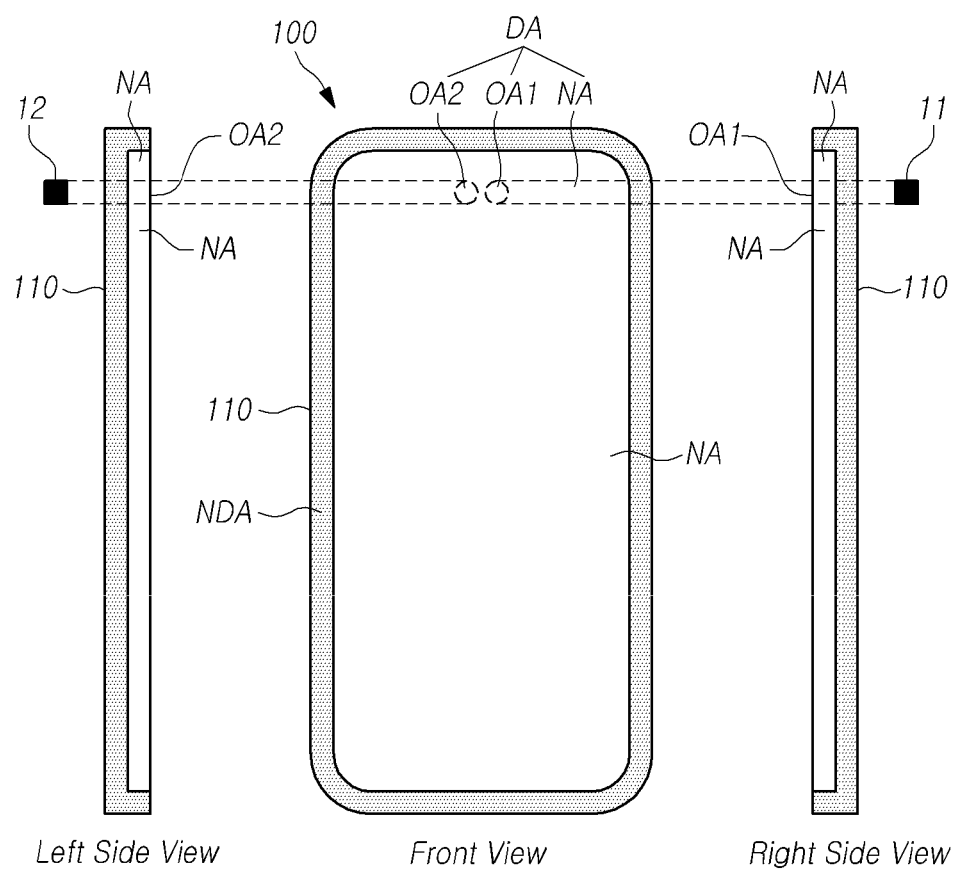

According to an example of FIG. 1C, the display area DA may include a first optical area OA1, a second optical area OA2, and a normal area NA. In the example of FIG. 1C, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

Figure 1D:
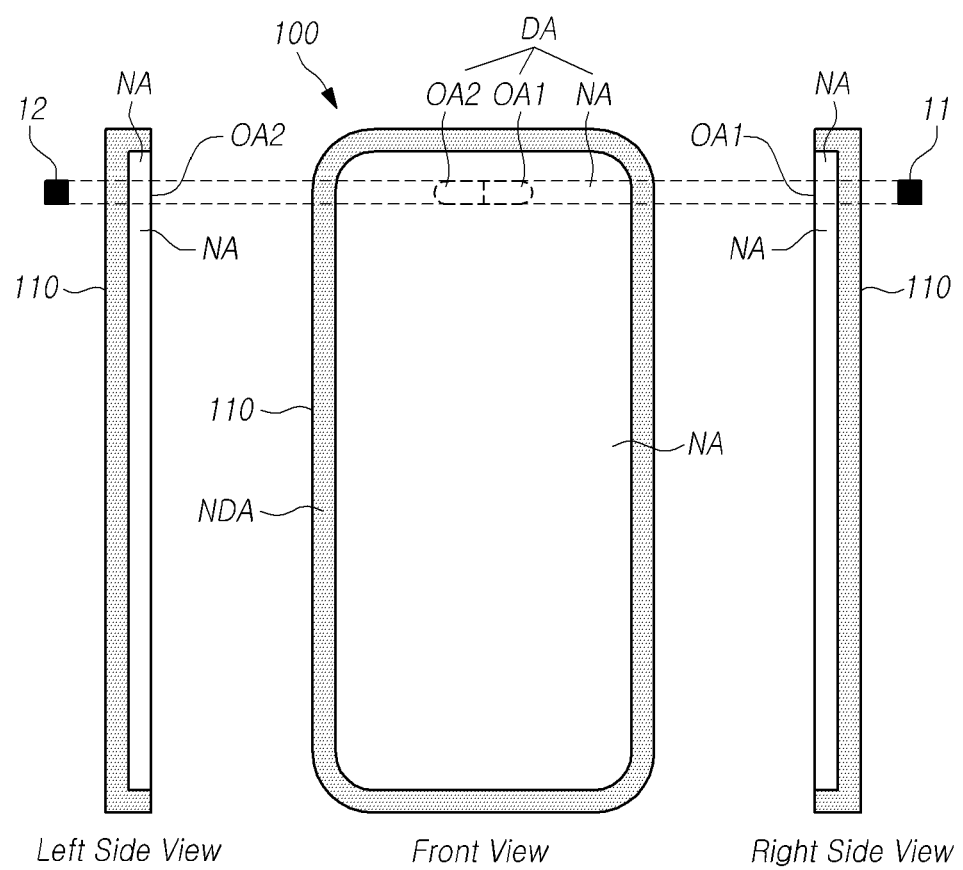

According to an example of FIG. 1D, the display area DA may include a first optical area OA1, a second optical area OA2, and a normal area NA. In the example of FIG. 1D, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

It is desirable that both an image display structure and a light transmission structure are formed in the one or more optical areas (OA1 and/or OA2). For example, since the one or more optical areas (OA1 and/or OA2) are a portion of the display area DA, therefore, it is desirable that subpixels for displaying an image are disposed in the one or more optical areas (OA1 and/or OA2). Further, to enable light to transmit the one or more optical electronic devices (11 and/or 12), it is desirable that a light transmission structure is formed in the one or more optical areas (OA1 and/or OA2).

Even though the one or more optical electronic devices (11 and/or 12) need to receive light, the one or more optical electronic devices (11 and/or 12) may be located on the back of the display panel 110 (e.g., on an opposite side of the viewing surface thereof). In this embodiment, the one or more optical electronic devices (11 and/or 12) may be located, for example, under, or in a lower portion of, the display panel 110, and can receive light that has transmitted the display panel 110.

For example, the one or more optical electronic devices (11 and/or 12) may not be exposed in the front surface (viewing surface) of the display panel 110. Accordingly, when a user looks at the front of the display device 100, the one or more optical electronic devices (11 and/or 12) may be located to be invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera.

Hereinafter, for convenience of description, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, 1C, and 1D are areas where images can be displayed, the normal area NA is an area where a light transmission structure need not be formed, but the one or more optical areas (OA1 and/or OA2) are areas where the light transmission structure need be formed. Thus, in some embodiments, the normal area NA is an area where a light transmission structure is not implemented or included, and the one or more optical areas (OA1 and/or OA2) are areas in which the light transmission structure is implemented or included.

Accordingly, the one or more optical areas (OA1 and/or OA2) may have a transmittance greater than or equal to a predetermined level, i.e., a relatively high transmittance, and the normal area NA may not have light transmittance or have a transmittance less than the predetermined level, i.e., a relatively low transmittance.

For example, the one or more optical areas (OA1 and/or OA2) may have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be lower than that of the normal area NA. Here, the number of subpixels per unit area may be a unit for measuring resolution, for example, referred to as pixels (or subpixels) per inch (PPI), which represents the number of pixels (or subpixels) within 1 inch.

In one embodiment, in each of FIGS. 1A, 1B, 1C, and 1D, the number of subpixels per unit area in the first optical areas OA1 may be less than the number of subpixels per unit area in the normal area NA. In one embodiment, in each of FIGS. 1C and 1D, the number of subpixels per unit area in the first optical areas OA1 may be greater than or equal to the number of subpixels per unit area in the second optical areas OA2.

In each of FIGS. 1A, 1B, 1C and 1D, the first optical area OA1 may have various shapes, such as a circle, an ellipse, a quadrangle, a hexagon, an octagon or the like. In each of FIGS. 1C and 1D, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

Herein, the display device 100 according to aspects of the present disclosure having a structure in which the first optical electronic device 11 located to be covered under, or in the lower portion of, the display panel 110 without being exposed to the outside is a camera may be referred to as a display (or display device) to which under-display camera (UDC) technology is applied.

The display device 100 according to this configuration can have an advantage of preventing the size of the display area DA from being reduced since a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11 and/or 12) are located to be covered on the back of (under, or in the lower portion of) the display panel 110 in the display device 100 according to aspects of the present disclosure, that is, hidden not to be exposed to the outside, the one or more optical electronic devices (11 and/or 12) are required to be able to receive and detect light for normally performing predefined functionality.

Further, in the display device 100 according to aspects of the present disclosure, although the one or more optical electronic devices (11 and/or 12) are located to be covered on the back of (under, or in the lower portion of) the display panel 110 and located to overlap the display area DA, it is desirable for image display to be normally performed in the one or more optical areas (OA1 and/or OA2) overlapping the one or more optical electronic devices (11 and/or 12) in the display area DA.

Figure 2:
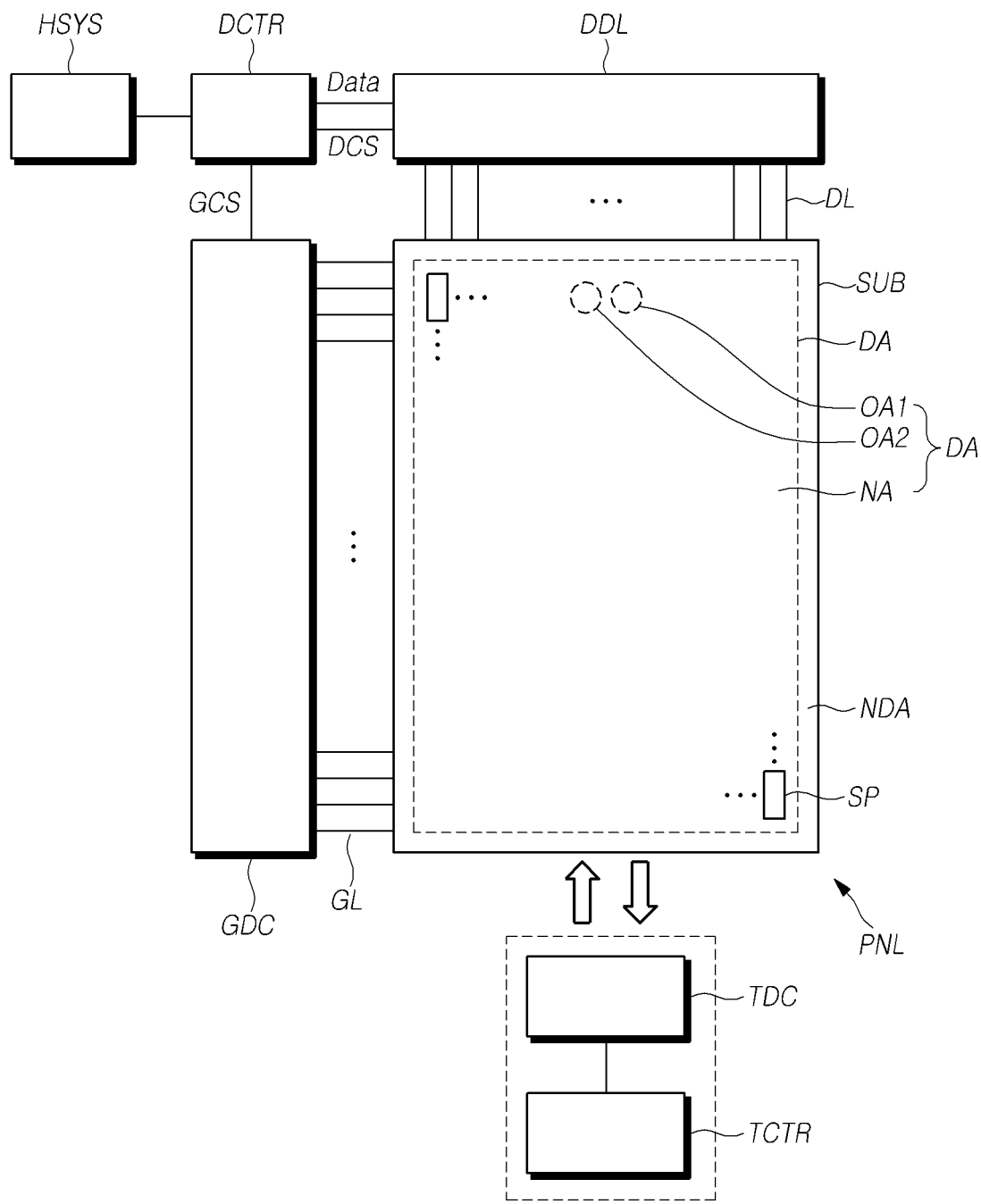
FIG. 2 illustrates an example system configuration of the display device according to aspects of the present disclosure.

FIG. 2 illustrates an example system configuration of the display device 100 according to aspects of the present disclosure.

Referring to FIG. 2, the display device 100 as components for displaying an image may include a display panel PNL (e.g., the display panel as in FIGS. 1A to 1D) and a display driving circuit.

The display driving circuit is a circuit for driving the display panel PNL, and may include a data driving circuit DDC, a gate driving circuit GDC, a display controller DCTR, and other components.

The display panel PNL may include a display area DA in which an image is displayed and a non-display area NDA in which an image is not displayed. The non-display area NDA may be an area outside of the display area DA, and may also be referred to as an edge area or a second bezel area. This is a second bezel area that is different from the bezel area that is located in the optical area and is in the display area. All or a portion of the non-display area NDA may be an area visible from the front surface of the display device 100, or an area that is bent and invisible from the front surface of the display device 100.

The display panel PNL may include a substrate SUB and a plurality of subpixels SP disposed on the substrate SUB. The display panel PNL may further include various types of signal lines to drive the plurality of subpixels SP.

In some embodiments, the display device 100 herein may be a liquid crystal display device, or the like, or a self-emission display device in which light is emitted from the display panel PNL itself. In some embodiments, when the display device 100 is the self-emission display device, each of the plurality of subpixels SP may include a light emitting element.

In one embodiment, the display device 100 according to aspects of the present disclosure may be an organic light emitting display device in which the light emitting element is implemented using an organic light emitting diode (OLED). In another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. For example, when the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (which may be also referred to as data voltages or image signals), a plurality of gate lines GL for carrying gate signals (which may be also referred to as scan signals), and the like.

The plurality of data lines DL and the plurality of gate lines GL may intersect each other. Each of the plurality of data lines DL may extend in a first direction. Each of the plurality of gate lines GL may extend in a second direction.

For example, the first direction may be a column or vertical direction, and the second direction may be a row or horizontal direction. In another example, the first direction may be the row direction, and the second direction may be the column direction.

The data driving circuit DDC is a circuit for driving the plurality of data lines DL, and can supply data signals to the plurality of data lines DL. The gate driving circuit GDC is a circuit for driving the plurality of gate lines GL, and can supply gate signals to the plurality of gate lines GL.

The display controller DCTR may be a device for controlling the data driving circuit DDC and the gate driving circuit GDC, and can control driving timing for the plurality of data lines DL and driving timing for the plurality of gate lines GL.

The display controller DCTR can supply a data driving control signal DCS to the data driving circuit DDC to control the data driving circuit DDC, and supply a gate driving control signal GCS to the gate driving circuit GDC to control the gate driving circuit GDC.

The display controller DCTR can receive input image data from a host system HSYS and supply image data Data to the data driving circuit DDC based on the input image data.

The data driving circuit DDC can supply data signals to the plurality of data lines DL according to driving timing control of the display controller DCTR.

The data driving circuit DDC can receive the digital image data Data from the display controller DCTR, convert the received image data Data into analog data signals, and supply the resulting analog data signals to the plurality of data lines DL.

The gate driving circuit GDC can supply gate signals to the plurality of gate lines GL according to timing control of the display controller DCTR. The gate driving circuit GDC can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit DDC may be connected to the display panel PNL in a tape automated bonding (TAB) type, or connected to a conductive pad such as a bonding pad of the display panel PNL in a chip on glass (COG) type or a chip on panel (COP) type, or connected to the display panel PNL in a chip on film (COF) type.

In some embodiments, the gate driving circuit GDC may be connected to the display panel PNL in the tape automated bonding (TAB) type, or connected to a conductive pad such as a bonding pad of the display panel PNL in the chip on glass (COG) type or the chip on panel (COP) type, or connected to the display panel PNL in the chip on film (COF) type. In another embodiment, the gate driving circuit GDC may be disposed in the non-display area NDA of the display panel PNL in a gate in panel (GIP) type. The gate driving circuit GDC may be disposed on or over the substrate, or connected to the substrate. That is, in the case of the GIP type, the gate driving circuit GDC may be disposed in the non-display area NDA of the substrate. The gate driving circuit GDC may be connected to the substrate in the case of the chip on glass (COG) type, the chip on film (COF) type, or the like.

In some embodiments, at least one of the data driving circuit DDC and the gate driving circuit GDC may be disposed in the display area DA of the display panel PNL. For example, at least one of the data driving circuit DDC and the gate driving circuit GDC may be disposed not to overlap subpixels SP, or disposed to be overlapped with one or more, or all, of the subpixels SP.

The data driving circuit DDC may also be located in, but not limited to, only one side or portion (e.g., an upper edge or a lower edge) of the display panel PNL. In some embodiments, the data driving circuit DDC may be located in, but not limited to, two sides or portions (e.g., an upper edge and a lower edge) of the display panel PNL or at least two of four sides or portions (e.g., the upper edge, the lower edge, a left edge, and a right edge) of the display panel PNL according to driving schemes, panel design schemes, or the like.

The gate driving circuit GDC may also be located in, but not limited to, only one side or portion (e.g., a left edge or a right edge) of the display panel PNL. In some embodiments, the gate driving circuit GDC may be located in, but not limited to, two sides or portions (e.g., a left edge and a right edge) of the display panel PNL, or be connected to at least two of four sides or portions (e.g., an upper edge, a lower edge, the left edge, and the right edge) of the display panel PNL according to driving schemes, panel design schemes, or the like.

The display controller DCTR may be implemented in a separate component from the data driving circuit DDC, or integrated with the data driving circuit DDC and thus implemented in an integrated circuit.

The display controller DCTR may be a timing controller used in the typical display technology or a controller or a control device capable of performing other control functions in addition to the function of the typical timing controller. In some embodiments, the display controller DCTR may be a controller or a control device different from the timing controller, or a circuitry or a component included in the controller or the control device. The display controller DCTR may be implemented with various circuits or electronic components such as an integrated circuit (IC), a field programmable GATE array (FPGA), an application specific integrated circuit (ASIC), a processor, and/or the like.

The display controller DCTR may be mounted on a printed circuit board, a flexible printed circuit, and/or the like and be electrically connected to the data driving circuit DDC and the gate driving circuit GDC through the printed circuit board, flexible printed circuit, and/or the like.

The display controller DCTR may transmit signals to, and receive signals from, the data driving circuit DDC via one or more predefined interfaces. In some embodiments, such interfaces may include a low voltage differential signaling (LVDS) interface, an embedded clock point-point (EPI) interface, a serial peripheral interface (SPI), and the like.

In some embodiments, in order to further provide a touch sensing function, as well as an image display function, the display device 100 may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include a touch driving circuit TDC capable of generating and providing touch sensing data by driving and sensing the touch sensor, a touch controller TCTR capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit TDC.

The touch sensor may be implemented in a touch panel, or in the form of a touch panel, outside of the display panel PNL, or be implemented inside of the display panel PNL. In the example where the touch sensor is implemented in the touch panel, or in the form of the touch panel, outside of the display panel PNL, such a touch sensor is referred to as an add-on type. In the example where the add-on type of touch sensor is disposed, the touch panel and the display panel PNL may be separately manufactured and coupled during an assembly process. The add-on type of touch panel may include a touch panel substrate and a plurality of touch electrodes on the touch panel substrate.

In the example where the touch sensor is implemented inside of the display panel PNL, a process of manufacturing the display panel PNL may include disposing the touch sensor over the substrate SUB together with signal lines and electrodes related to driving the display device 100.

The touch driving circuit TDC can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit TDC can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit TDC can drive the driving touch electrodes and sense the sensing touch electrodes.

The touch driving circuit TDC and the touch controller TCTR included in the touch sensing circuit may be implemented in separate devices or components or in a single device or component. Further, the touch driving circuit TDC and the data driving circuit DDC may be implemented in separate devices or components or in a single device or component.

The display device 100 may further include a power supply circuit for supplying various types of power to the display driving circuit and/or the touch sensing circuit.

In some embodiments, the display device 100 may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel PNL may include a normal area (e.g., the normal area NA of FIGS. 1A, 1B, 1C, and 1D) and one or more optical areas (e.g., the first and/or second optical areas OA1 and/or OA2 of FIGS. 1A, 1B, 1C, and 1D).

The normal area NA and the one or more optical areas (OA1 and/or OA2) may be areas where an image can be displayed. In some embodiments, the normal NA may be an area in which a light transmission structure need not be implemented, and the one or more optical areas (OA1 and/or OA2) may be areas in which the light transmission structure need be implemented.

As discussed above with respect to the examples of FIGS. 1A, 1B, 1C, and 1D, although the display area DA of the display panel PNL may include the one or more optical areas (OA1 and/or OA2) in addition to the normal area NA, for convenience of description, in discussions that follow, it is assumed that the display area DA includes first and second optical areas (OA1 and OA2) and the normal area NA; and the normal area NA and the first optical area OA1 thereof include the normal areas NAs and the first optical areas OA1s of FIGS. 1A to 1D, respectively, and the second optical area OA2 thereof includes the second optical areas OA2s of FIGS. 1C and 1D, unless explicitly stated otherwise.

Figure 3:
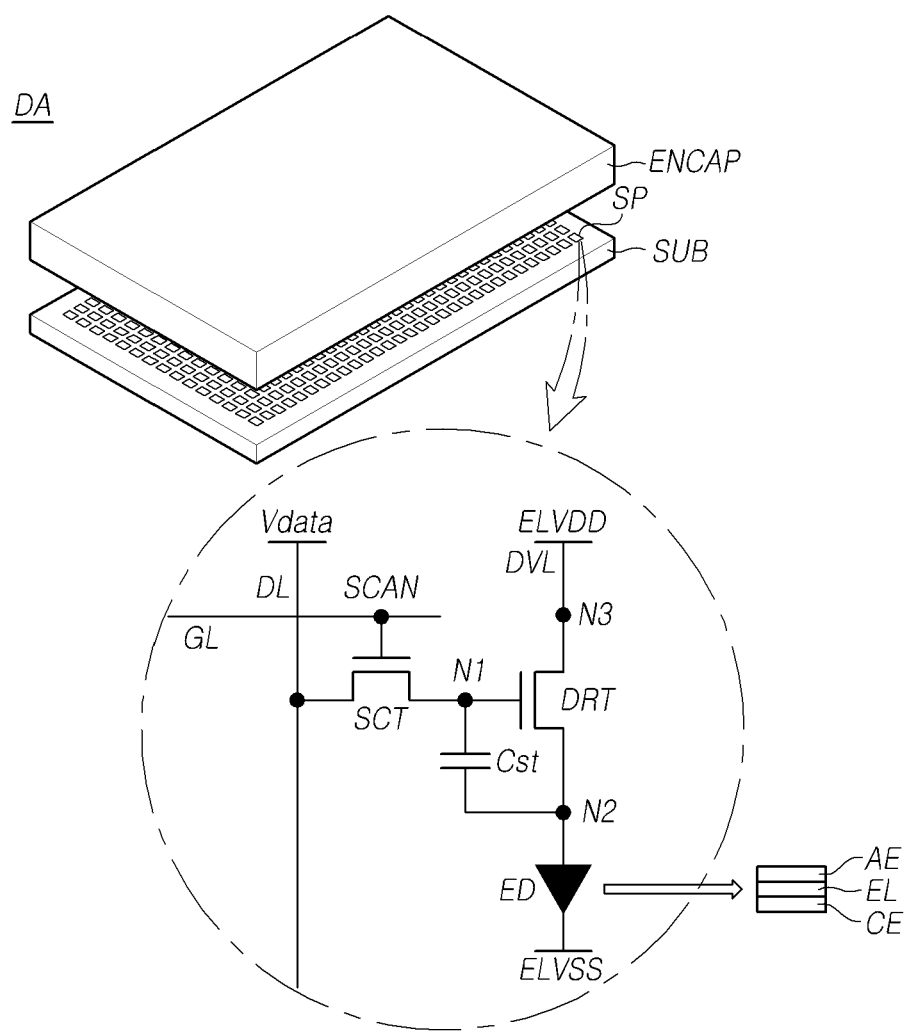
FIG. 3 illustrates an example equivalent circuit of a subpixel in a display panel according to aspects of the present disclosure.

FIG. 3 illustrates an example equivalent circuit of a subpixel SP in the display panel PNL according to aspects of the present disclosure.

Each of subpixels SP disposed in the normal area NA, the first optical area OA1, and the second optical area OA2 included in the display area DA of the display panel PNL may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT may include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED may include an anode electrode AE, an emission layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in discussions that follow, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (which may be referred to as a "2T1C structure") as illustrated in FIG. 3, and in some cases, may further include one or more transistors, or further include one or more capacitors.

In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel PNL in order to prevent the external moisture or oxygen from penetrating into the circuit elements (e.g., in particular, the light emitting element ED). The encapsulation layer ENCAP may be disposed on the light emitting element ED such that is covers the light emitting element ED.

In some embodiments, as a method for increasing a transmittance of at least one of the first optical area OA1 and the second optical area OA2, a technique may be applied so that a density of pixels (or subpixels) or a degree of integration of pixels (or subpixels) can be differentiated (which may be referred to as a "pixel density differentiation design scheme"). According to the pixel density differentiation design scheme, in one embodiment, the display panel PNL may be designed such that the number of subpixels per unit area of at least one of the first optical area OA1 and the second optical area OA2 is greater than the number of subpixels per unit area of the normal area NA.

In another embodiment, as another method for increasing a transmittance of at least one of the first optical area OA1 and the second optical area OA2, another technique may be applied so that a size of a pixel (or a subpixel) can be differentiated (which may be referred to as a "pixel size differentiation design scheme"). According to the pixel size differentiation design scheme, the display panel PNL may be designed such that the number of subpixels per unit area of at least one of the first optical area OA1 and the second optical area OA2 is equal to or similar to the number of subpixels per unit area of the normal area NA; however, a size of each subpixel SP (i.e., a size of a corresponding light emitting area) disposed in at least one of the first optical area OA1 and the second optical area OA2 is smaller than a size of each subpixel SP (i.e., a size of a corresponding light emitting area) disposed in the normal area NA.

For convenience of description, discussions that follow are provided based on the pixel density differentiation design scheme of the two schemes (i.e., the pixel density differentiation design scheme and the pixel size differentiation design scheme) for increasing the transmittance of at least one of the first optical area OA1 and the second optical area OA2, unless explicitly stated otherwise.

FIG. 4 illustrates example arrangements of subpixels SP in the three areas (NA, OA1, and OA2) included in the display area DA of the display panel PNL according to aspects of the present disclosure.

Referring to FIG. 4, in some embodiments, a plurality of subpixels SP may be disposed in each of the normal area NA, the first optical area OA1, and the second optical area OA2 included in the display area DA.

The plurality of subpixels SP may include, for example, a red subpixel Red SP emitting red light, a green subpixel Green SP emitting green light, and a blue subpixel Blue SP emitting blue light.

Accordingly, each of the normal area NA, the first optical area OA1, and the second optical area OA2 may include one or more light emitting areas EA of one or more red subpixels Red SP, and one or more light emitting areas EA of one or more green subpixels Green SP, and one or more light emitting areas EA of one or more blue subpixels Blue SP.

Referring to FIG. 4, the normal area NA may not include a light transmission structure, but may include light emitting areas EA.

In contrast, it is desirable that the first optical area OA1 and the second optical area OA2 include both the light emitting areas EA and the light transmission structure.

Accordingly, in some embodiments, the first optical area OA1 may include one or more light emitting areas EA and one or more first transmission areas TA1, and the second optical area OA2 may include one or more light emitting areas EA and one or more second transmission areas TA2.

The light emitting areas EA and the transmission areas (TA1 and/or TA2) may be distinct according to whether the transmission of light is allowed. For example, the light emitting areas EA may be areas not allowing light to transmit (e.g., not allowing light to transmit to the back of the display panel), and the transmission areas (TA1 and/or TA2) may be areas allowing light to transmit (e.g., allowing light to transmit to the back of the display panel).

The light emitting areas EA and the transmission areas (TA1 and/or TA2) may be also distinct according to whether or not a specific metal layer is included. For example, the cathode electrode CE as illustrated in FIG. 3 may be disposed in the light emitting areas EA, and the cathode electrode CE may not be disposed in the transmission areas (TA1 and/or TA2). In some embodiments, a light shield layer may be disposed in the light emitting areas EA, and a light shield layer may not be disposed in the transmission areas (TA1 and/or TA2).

Since the first optical area OA1 includes the first transmission areas TA1 and the second optical area OA2 includes the second transmission areas TA2, both of the first optical area OA1 and the second optical area OA2 are areas through which light can transmit.

In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have substantially a same shape or size. In another example, even when the first transmission area TA1 of the first optical area OA1 and the second transmission area TA2 of the second optical area OA2 have different shapes or sizes, a size ratio of the first transmission area TA1 to the first optical area OA1 and a size ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have substantially the same shape or size, a size ratio of the first transmission area TA1 to the first optical area OA1 and a size ratio of the second transmission area TA2 to the second optical area OA2 may be different from each other.

For example, in the example where the first optical electronic device 11, as illustrated in FIGS. 1A, 1B, 1C, and 1D, overlapping the first optical area OA1 is a camera, and the second optical electronic device 12, as illustrated in FIGS. 1C and 1D, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have substantially the same size, a size ratio of the first transmission area TA1 to the first optical area OA1 may be greater than a size ratio of the second transmission area TA2 to the second optical area OA2.

For convenience of description, discussions that follows are provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in discussions that follow, it is assumed that the first optical areas OA1 and the second optical areas OA2 are located in an upper edge of the display area DA of the display panel PNL, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1 and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include only the normal area NA.

FIG. 5A illustrates example arrangements of signal lines in each of a first optical area (e.g., the first optical area OA1 in the figures discussed above) and a normal area (e.g., the normal area NA in the figures discussed above) of the display panel PNL according to aspects of the present disclosure. FIG. 5B illustrates example arrangements of signal lines in each of a second optical area (e.g., the second optical area OA2 in the figures discussed above) and the normal area NA of the display panel PNL according to aspects of the present disclosure.

A first horizontal display area HA1 shown in FIGS. 5A and 5B is a portion of a first horizontal display area (e.g., the first horizontal display area HA1 of FIG. 4) of the display panel PNL, and a second horizontal display area HA2 is a portion of a second horizontal display area (e.g., the second horizontal display area HA2 of FIG. 4) of the display panel PNL.

The first optical area OA1 shown in FIG. 5A is a portion of a first optical area (e.g., the first optical area OA1 in the figures discussed above) of the display panel PNL, and the second optical area OA2 shown in FIG. 5B is a portion of a second optical area (e.g., the second optical area OA2 in the figures discussed above) of the display panel PNL.

Referring to FIGS. 5A and 5B, the first horizontal display area HA1 may include a portion of the normal area NA, the first optical area OA1, and the second optical area OA2. The second horizontal display area HA2 may include only the normal area NA.

Various types of horizontal lines (HL1 and HL2) and various types of vertical lines (VLn, VL1, and VL2) may be disposed in the display panel PNL.

In some embodiments, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL extends and, and the vertical direction may refer to, for example, a direction in which one data line DL extends. As such, the term horizontal and the term vertical are used to represent two directions.

Referring to FIGS. 5A and 5B, the horizontal lines disposed in the display panel PNL may include first horizontal lines HL1 disposed in the first horizontal display area HA1 and second horizontal lines HL2 disposed in the second horizontal display area HA2.

The horizontal lines disposed in the display panel PNL may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel PNL may include normal vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel PNL may include data lines DL, driving voltage lines DVL, and the like, and may further include reference voltage lines, initialization voltage lines, and the like. That is, the normal vertical lines VLn, the first vertical lines VL1 and the second vertical lines VL2 may include data lines DL, driving voltage lines DVL, and the like, and further include reference voltage lines, initialization voltage lines, and the like.

In some embodiments, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the normal vertical line VLn may mean only that a signal is carried from an upper portion, to a lower portion, of the display panel (or from the lower portion to the upper portion), and may not mean that the normal vertical line VLn runs in a straight line only in the direct vertical direction. For example, in FIGS. 5A and 5B, although the normal vertical lines VLn are illustrated in a straight line, one or more of the normal vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal display area HA1 may include light emitting areas EA, as shown in FIG. 4, and first transmission areas TA1. In the first optical area OA1, an area outside of the first transmission areas TA1 may include light emitting areas EA.

Referring to FIG. 5A, in order to improve the transmittance of the first optical area OA1, the first horizontal lines HL1 may run through the first optical area OA1 while avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal display area HA1 and the second horizontal lines HL2 disposed in the second horizontal display area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 while avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the normal vertical lines VLn disposed in the normal area NA without running through the first optical area OA1 may have different shapes or lengths.

Referring to FIG. 5A, the first transmission areas TA1 included in the first optical area OA1 in the first horizontal display area HA1 may be arranged in a diagonal direction.

Referring to FIG. 5A, in the first optical area OA1 in the first horizontal display area HAL one or more light emitting areas EA may be disposed between two horizontally adjacent first transmission areas TA1. In the first optical area OA1 in the first horizontal display area HA1 one or more light emitting areas EA may be disposed between two first transmission areas TA1 adjacent to each other in up and down directions (e.g., two vertically adjacent first transmission areas TA1).

Referring to FIG. 5A, each of the first horizontal lines HL1 disposed in the first horizontal display area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal display area HA1 may include light emitting areas EA and second transmission areas TA2. In the second optical area OA2, an area outside of the second transmission areas TA2 may include light emitting areas EA.

In one embodiment, the light emitting areas EA and the second transmission areas TA2 in the second optical area OA2 may have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in left and right directions (e.g., the horizontal direction). Further, one or more of the light emitting areas EA in the second optical area OA2 may be disposed between second transmission areas TA2 adjacent to each other in up and down directions (e.g., the vertical direction). For example, one or more light emitting areas EA may be disposed between two rows of second transmission areas.

When in the first horizontal display area HA1 the first horizontal lines HL1 run through the first optical area OA1 and the normal area NA adjacent to the first optical area OA1, in one embodiment, the first horizontal lines HL1 may have substantially the same arrangement as the first horizontal lines HL1 of FIG. 5A.

In another embodiment, as shown in FIG. 5B, when in the first horizontal display area HA1 running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal display area HA1 the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 while avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the normal vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to a light transmitting structure, since the first optical area OA1 that at least partially overlaps the first optical electronic device 11 includes the first transmitting areas TA1, and the second optical area OA2 that at least partially overlaps the second optical electronic device 12 includes the second transmission areas TA2, therefore, the first optical area OA1 and the second optical area OA2 may have the number of subpixels per unit area smaller than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is less than the number of subpixels (the second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly less than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly less than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
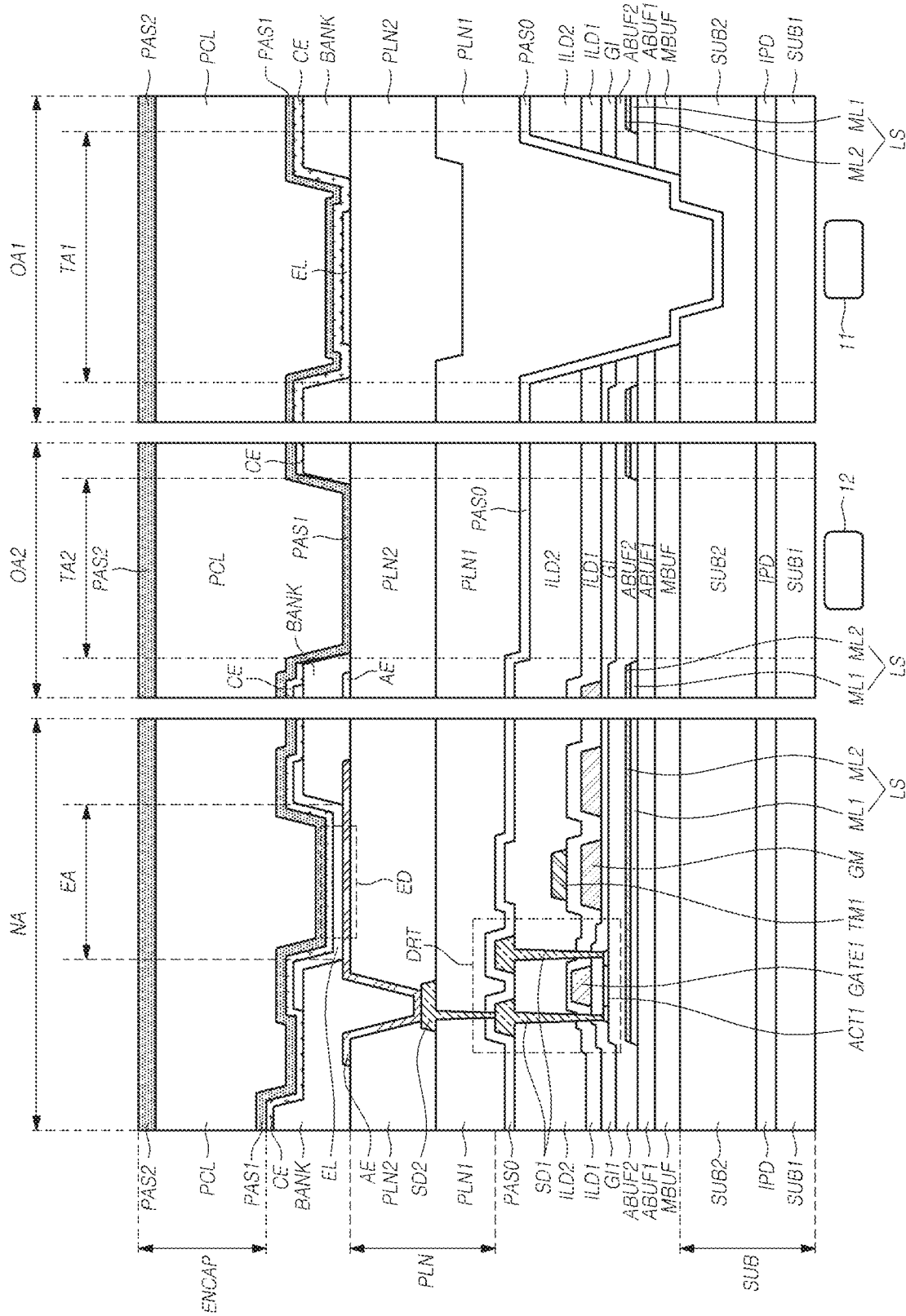
FIGS. 6 and 7 are example cross-sectional views of the first optical area, the second optical area, and the normal area included in the display area of the display panel according to various aspects of the present disclosure.
Figure 7:
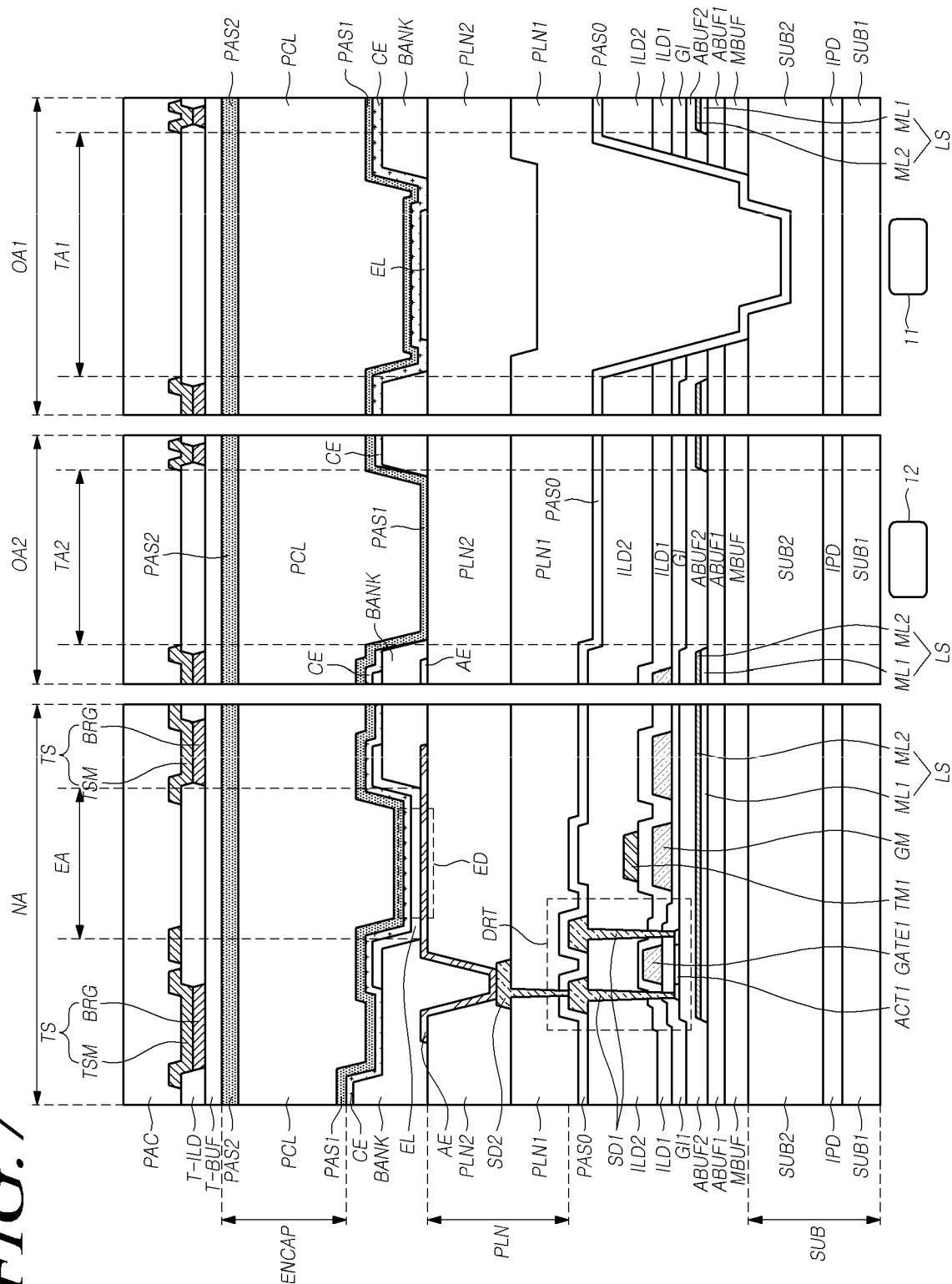

FIGS. 6 and 7 are example cross-sectional views of a first optical area (e.g., the first optical area OA1 in the figures discussed above), a second optical area (e.g., the second optical area OA2 in the figures discussed above), and a normal area (e.g., the normal area NA in the figures discussed above) included in the display area DA of the display panel PNL according to aspects of the present disclosure.

FIG. 6 illustrates the display panel PNL in an example where a touch sensor is present outside of the display panel PNL in the form of a touch panel. FIG. 7 illustrates the display panel PNL in an example where a touch sensor TS is present inside of the display panel PNL.

Each of FIGS. 6 and 7 shows example cross-sectional views of the normal area NA, the first optical area OA1, and the second optical area OA2 included in the display area DA.

First, a stack-up configuration of the normal area NA will be described with reference to FIGS. 6 and 7. Respective light emitting areas EA of the first optical area OA1 and the second optical area OA2 may have the same stack-up configuration as a light emitting area EA of the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns (ACT1, SD1, and/or GATE1), for disposing one or more transistors such as a driving transistor DRT, a scan transistor SCT, and the like, various types of insulating layers (MBUF, ABUF1, ABUF2, GI, ILD1, ILD2, and/or PAS0), and various types of metal patterns (TM1, GM, ML1, and/or ML2) may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. A first active layer ACT1 of a transistor (e.g., a driving transistor DRT) may be disposed on the second active buffer layer ABUF2. The term active layer ACT refers to a semiconductor active layer and it can be comprised of one or more semiconductor layers.

A first gate insulating layer GI1 may be disposed on the first active layer ACT1 such that it covers the first active layer ACT1.

A first gate electrode GATE1 of the driving transistor DRT may be disposed on the first gate insulating layer GI1. In an embodiment, a gate material layer GM may be disposed on the first gate insulating layer GI1, together with the first gate electrode GATE1 of the driving transistor DRT, at a location different from a location where the driving transistor DRT is disposed.

A first interlayer insulating layer ILD1 may be disposed on the first gate electrode GATE1 and the gate material layer GM such that it covers the first gate electrode GATE1 and the gate material layer GM. A metal pattern TM1 may be disposed on the first interlayer insulating layer ILD1. The metal pattern TM1 may be located at a location different from the location where the driving transistor DRT is disposed. A second interlayer insulating layer ILD2 may be disposed on the metal pattern TM1 on the first interlayer insulating layer ILD1 such that it covers the metal pattern TM1.

Two first source-drain electrode patterns SD1s may be disposed on the second interlayer insulating layer ILD2. One of the two first source-drain electrode patterns SD1s may be a source node of the driving transistor DRT, and the other thereof may be a drain node of the driving transistor DRT. The term source-drain electrode is used herein in the broadest sense to include either a source electrode, a drain electrode or both a source and a drain electrode. As is known to those of skill in the art, a particular electrode contacting an active area of a transistor can be either source or a drain electrode and the name by which the electrode is called might change based on the electrical connection and the voltages present on various nodes of the transistor at any particular time. Thus, it is common in the art to refer to such electrodes as source-drain electrodes.

The two first source-drain electrode patterns SD1s may be electrically connected to first and second portions (e.g., first and second side portions) of the first active layer ACT1, respectively, through contact holes formed in the second interlayer insulating layer ILD2, the first interlayer insulating layer ILD1, and the first gate insulating layer GIL A portion of the first active layer ACT1 overlapping the first gate electrode GATE1 may be referred to as a channel region. One of the two first source-drain electrode patterns SD1s may be connected to a first portion (e.g., a first side portion) of the channel region of the first active layer ACT1, and the other of the two first source-drain electrode patterns SD1 may be connected to a second portion (e.g., a second side portion) of the channel region of the first active layer ACT1.

A passivation layer PAS0 may be disposed on the two first source-drain electrode patterns SD1s such that it covers the two first source-drain electrode patterns. A planarization layer PLN may be disposed on the passivation layer PAS0. The planarization layer PLN may include a first planarization layer PLN1 and a second planarization layer PLN2.

For example, the first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1s (corresponding to the second node N2 of the driving transistor DRT in the subpixel SP of FIG. 3) through a contact hole formed in the first planarization layer PLN1.

The second planarization layer PLN2 may be disposed on the second source-drain electrode pattern SD2 such that it covers the second source-drain electrode pattern SD2. A light emitting element ED of a subpixel SP may be disposed on the second planarization layer PLN2.

According to an example stack-up configuration of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed on the anode electrode AE such that it covers a portion of the anode electrode AE. A portion of the bank BANK corresponding to the light emitting area EA of the subpixel SP may be opened.

A portion of the anode electrode AE may be exposed through the opening (the opened portion) of the bank BANK. An emission layer EL may be disposed on one or more side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE. The emission layer EL may include an organic material layer.

An encapsulation layer ENCAP may be disposed on the stack of the light emitting element ED.

The encapsulation layer ENCAP may have a single-layer stack or a multi-layer stack. For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the stack of the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet technique.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize or prevent external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiOx), silicon oxynitride (SiON), aluminum oxide ($Al_2O_3$), or the like.

Referring to FIG. 7, in an example where a touch sensor TS is embedded into the display panel PNL, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM are required to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is formed on the display panel PNL, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined temperature (e.g., 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed on the touch sensor TS such that it covers the touch sensor TS. The protective layer PAC may be, for example, an organic insulating layer.

Next, a stack-up configuration of the first optical area OA1 will be described with reference to FIGS. 6 and 7.

Referring to FIGS. 6 and 7, the light emitting area EA of the first optical area OA1 may have the same stack-up configuration as that of the normal area NA. Accordingly, in the discussion that follows, for the sake of brevity, instead of repeatedly describing the light emitting area EA of the first optical area OA1, a stack-up configuration of a first transmission area TA1 of the first optical area OA1 will be described in detail below.

In some embodiments, the cathode electrode CE may be disposed in the light emitting areas EA included in the normal area NA and the first optical area OA1, but may not be disposed in the first transmission area TA1 included in the first optical area OA1. For example, the first transmission area TA1 in the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 included in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical conductive properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE1, GM, TM1, SD1, SD2) and the semiconductor layer ACT1 related to at least one transistor may not be disposed in the first transmission area TA1.

Referring to FIGS. 6 and 7, in some embodiments, an anode electrode AE and a cathode electrode CE included in a light emitting element ED may not be disposed in the first transmission area TA1. In some embodiments, an emission layer EL included in a light emitting element ED may or may not be disposed in the first transmission area TA1 according to a design requirement.

Further, referring to FIG. 7, in some embodiments, a touch sensor metal TSM and a bridge metal BRG included in a touch sensor TS may not be disposed in the first transmission area TA1 in the first optical area OA1.

Accordingly, the light transmittance of the first transmission area TA1 in the first optical area OA1 can be provided or improved because material layers (e.g., one or more metal material layers, and/or one or more semiconductor layers) having some level of electrical conductive properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desirable to further increase a transmittance of the first transmission area TA1 in the first optical area OA1.

To achieve the foregoing, in the display panel PNL of the display device 100 according to aspects of the present disclosure, a transmittance improvement structure (TIS) may be provided to the first transmission area TA1 of the first optical area OA1.

Referring to FIGS. 6 and 7, the plurality of insulating layers included in the display panel PNL may include at least one buffer layer (MBUF, ABUF1, and/or ABUF2) between at least one substrate (SUB1 and/or SUB2) and at least one transistor (DRT and/or SCT), at least one planarization layers (PLN1 and/or PLN2) between the transistor DRT and the light emitting element ED, at least one encapsulation layer ENCAP on the light emitting element ED, and the like.

Referring to FIG. 7, the plurality of insulating layers included in the display panel PNL may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure (TIS).

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD1, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure (TIS). For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure (TIS) in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed on the touch sensor TS on the encapsulation layer ENCAP such that the protective layer PAC covers the touch sensor TS.

Referring to FIG. 7, the protective layer PAC may have at least one depression (e.g., a recess, a trench, a concave portion, a protrusion, or the like) as a transmittance improvement structure (TIS) in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to a light emitting area EA of a subpixel SP.

In order for the first optical area OA1 to have a transmittance greater than the normal area NA, an area or size of the touch sensor metal TSM per unit area in the first optical area OA1 may be smaller than an area or size of the touch sensor metal TSM per unit area in the normal area NA.

Referring to FIG. 7, in some embodiments, a touch sensor TS may be disposed in the light emitting area EA in the first optical area OA1, but may not be disposed in the first transmission area TA1 in the first optical area OA1.

Next, a stack-up configuration of the second optical area OA2 will be described with reference to FIGS. 6 and 7.

Referring to FIGS. 6 and 7, the light emitting area EA of the second optical area OA2 may have the same stack-up configuration as the light emitting area EA of the normal area NA. Accordingly, in the discussion that follows, for the sake of brevity, instead of repeatedly describing the light emitting area EA of the second optical area OA2, a stack-up configuration of a second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 included in the second optical area OA2. For example, the second transmission area TA2 in the second optical area OA2 may correspond to an opening of the cathode electrode CE.

In an embodiment, the light shield layer LS including at least one of the first metal layer ML1 and the second metal layer ML2 may be disposed in the light emitting areas EA included in the normal area NA and the second optical area OA2, but may not be disposed in the second transmission area TA2 in the second optical area OA2. For example, the second transmission area TA2 in the second optical area OA2 may correspond to an opening of the light shield layer LS.

In an example where the transmittance of the second optical area OA2 and the transmittance of the first optical area OA1 are the same, a stack-up configuration of the second transmission area TA2 in the second optical area OA2 may be the same as the stack-up configuration of the first transmission area TA1 in the first optical area OA1.

In another example where the transmittance of the second optical area OA2 and the transmittance of the first optical area OA1 are different, a stack-up configuration of the second transmission area TA2 in the second optical area OA2 may be different at least in part from as the stack-up configuration of the first transmission area TA1 in the first optical area OA1.

For example, as shown in FIGS. 6 and 7, in some embodiments, when the transmittance of the second optical area OA2 is lower than the transmittance of the first optical area OA1, the second transmission area TA2 in the second optical area OA2 may not have a transmittance improvement structure (TIS). As a result, the first planarization layer PLN1 and the passivation layer PAS0 may not be indented or depressed. In an embodiment, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 of the second optical area OA2 equally, substantially equally, or similarly.

However, in some embodiments, all, or one or more, of one or more material layers having electrical conductive properties (e.g., one or more metal material layers, and/or one or more semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE1, GM, TM1, SD1, SD2) and the semiconductor layer ACT1 related to at least one transistor may not be disposed in the second transmission area TA2 in the second optical area OA2.

Further, referring to FIGS. 6 and 7, in some embodiments, an anode electrode AE and a cathode electrode CE included in a light emitting element ED may not be disposed in the second transmission area TA2 in the second optical area OA2. In some embodiments, an emission layer EL of a light emitting element ED may or may not be disposed in the second transmission area TA2 in the second optical area OA2.

Further, referring to FIG. 7, in some embodiments, a touch sensor metal TSM and a bridge metal BRG included in a touch sensor TS may not be disposed in the second transmission area TA2 in the second optical area OA2.

Accordingly, the light transmittance of the second transmission area TA2 in the second optical area OA2 can be provided or improved because material layers (e.g., one or more metal material layers, and/or one or more semiconductor layers) having some level of electrical conductive properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
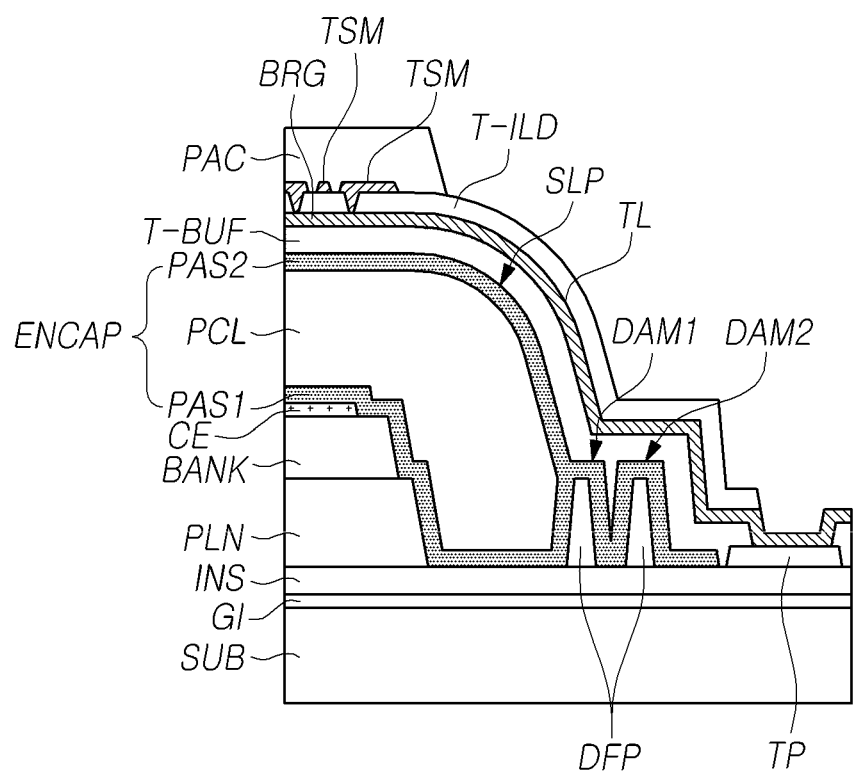
FIG. 8 is an example cross-sectional view of an edge of the display panel according to aspects of the present disclosure.

FIG. 8 is an example cross-sectional view of an edge of the display panel PNL according to aspects of the present disclosure.

For the sake of brevity, in FIG. 8, a single substrate SUB including the first substrate SUB1 and the second substrate SUB2 is illustrated, and layers or portions located under the bank BANK are illustrated in a simplified structure. Further, FIG. 8 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the stack of the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first encapsulation layer PAS1 and the second encapsulation layer PCL.

Referring to FIG. 8, in order to prevent the encapsulation layer ENCAP from collapsing, the display panel PNL may include one or more dams (DAM1 and/or DAM2) at, or near to, an end or edge of an inclined surface SLP of the encapsulation layer ENCAP. The one or more dams (DAM1 and/or DAM2) may be present at, or near to, a boundary point between the display area DA and the non-display area NDA.

The one or more dams (DAM1 and/or DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material may be located on at least the first dam DAM1 among the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the second dam DAM2.

Referring to FIG. 8, a touch pad TP, to which the touch driving circuit TDC, as shown in FIG. 2, is electrically connected, may be disposed in a portion of the substrate SUB outside of the one or more dams (DAM1 and/or DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2).

Referring to FIG. 8, in one embodiment, at least a portion of the touch line TL may serve as the bridge metal BRG. In another embodiment, at least a portion of the touch line TL may serve as the touch sensor metal TSM.

Figure 9:
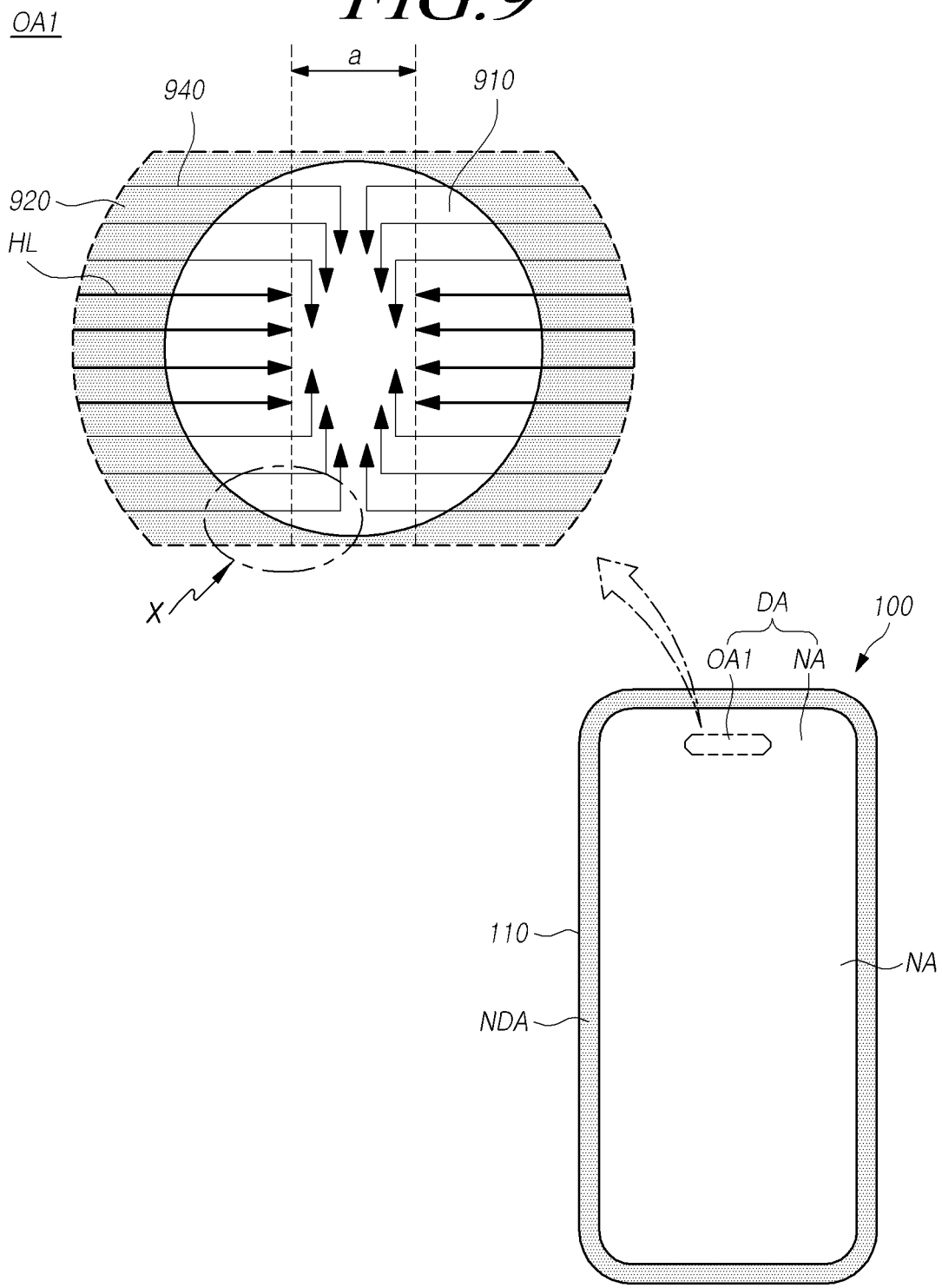
FIG. 9 is an example plan view of the first optical area of the display device according to aspects of the present disclosure.

FIG. 9 is an example plan view of the first optical area OA1 of the display device according to aspects of the present disclosure.

Referring to FIG. 9, the first optical area OA1 may include a central area 910 and a bezel area 920 located outside of the central area 910.

The first optical area OA1 may include a plurality of horizontal lines HL. Transistors located in the bezel area 920 and light emitting elements located in the central area 910 may be connected through the plurality of horizontal lines HL.

In some embodiments, the display device may include a routing structure 940. The central area 910 can be expanded by a predetermined area (a) through the routing structure 940. This is because pixels located in the predetermined area (a) can be connected to transistors located in the bezel area 920 through the routing structure 940.

The structure of the first optical area OA1 including the routing structure 920 will be discussed in detail below.

Figure 10:
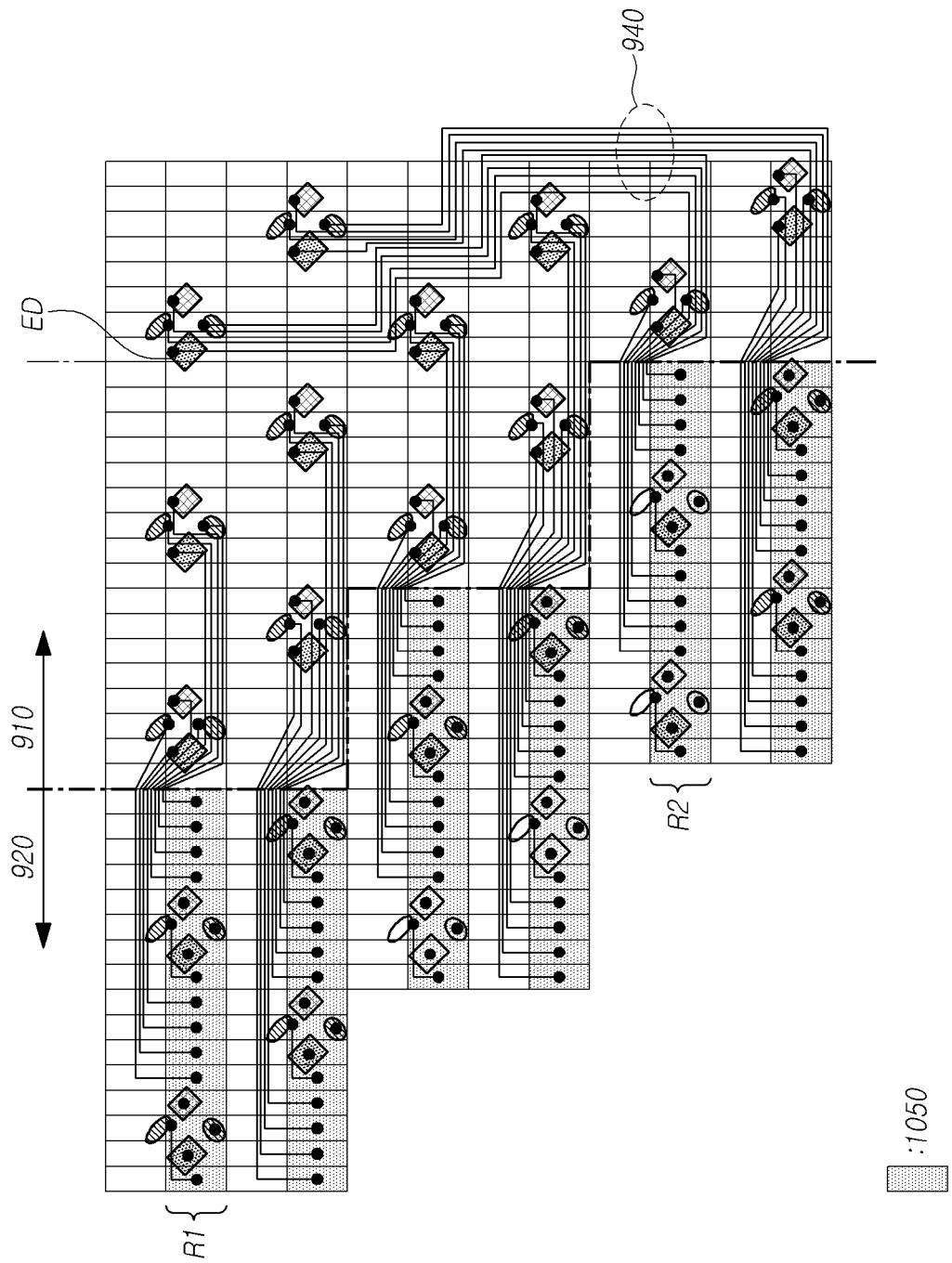
FIG. 10 is an expanded view of an X portion in FIG. 9.

FIG. 10 is an expanded view of an X portion in FIG. 9.

Referring to FIG. 10, the first optical area may include a plurality of light emitting elements ED located in the central area 910 and the bezel area 920. Since the first optical area includes the plurality of light emitting elements ED, an image can be displayed in the first optical area.

The first optical area may include a plurality of transistors 1050 located in the bezel area 920. A transistor 1050 may not be located in the central area 910. Since a transistor is not located in the central area 910, the central area 910 may have a higher transmittance.

The first optical area OA1 may include a plurality of rows including a first row R1 and a second row R2. The plurality of rows included in the first optical area OA1 may be areas that define the first optical area in the horizontal direction and may be defined by patterns of transistors 1050.

The display device may include light emitting elements ED located in the central area 910 and located in the first row R1, and transistors 1050 located in the bezel area 920 and located in the second row R2.

The display device may include the routing structure 940 electrically connecting the light emitting elements ED located in the first row R1 and the transistor 1050 located in the second row R2.

Since the transistors 1050 and the light emitting elements ED located in different rows can be connected to each other through the routing structure 940, the transistors located in the row in which the greater number of transistors than the number of light emitting elements are disposed can be connected to the light emitting elements located in the row in which the greater number of light emitting elements than the number of transistors are disposed. One or more of the plurality of transistors of the bezel area 920 may be electrically connected to the plurality of light emitting elements disposed in the bezel area 920, and the remaining one or more of the plurality of transistors may be electrically connected to the plurality of light emitting elements disposed in the central area 910.

The number of light emitting elements ED included in the first row R1 of the central area 910 may be greater than the number of light emitting elements ED included in the second row R2 of the central area 910. For example, a relatively greater number of transistors are required to drive the light emitting elements ED included in the first row R1, and a relatively less number of transistors are required to drive the light emitting elements ED included in the second row R2. Accordingly, one or more surplus transistors not electrically connected to light emitting elements located in the second row R2 among transistors located in the second row R2 of the bezel area 920 may be electrically connected to light emitting elements ED located in the first row R1 through the routing structure 940.

The number of pixels per unit area disposed in the entire area of the central area 910 may be substantially equal. For example, this means that one pixel pattern is substantially uniform in the entire area of the central area 910. Accordingly, a greater number of light emitting elements ED may be located in the first row R1 because the first row R1 has an area overlapping the central area 910 greater than the second row R2.

For example, the number of transistors 1050 included in the first row R1 of the bezel area 920 may be substantially the same as the number of transistors 1050 included in the second row R2 of the bezel area 920. In such an example, when the number of light emitting elements ED included in the first row R1 of the central area 910 is relatively greater, and the number of light emitting elements ED included in the second row R2 of the central area 910 is relatively smaller, one or more of transistor 1050 included in the second row R2 may be electrically connected to light emitting elements ED located in the first row R1 without being electrically connected to the light emitting elements ED located in the second row R2.

The number of pixels per unit area disposed in the entire area of the bezel area 920 may be substantially equal. For example, this means that one pixel pattern is substantially uniform in the entire area of the bezel area 920.

A size or area of a portion of the bezel area 920 overlapping the first row R1 may be substantially the same as a size or area of a portion of the bezel area 920 overlapping the second row R2. In such an example, the number of transistors 1050 included in the first row R1 of the bezel area 920 may be substantially the same as the number of transistors 1050 included in the second row R2 of the bezel area 920.

As a result of forming the bezel area 920 as described above, the number of transistors 1050 located in each row of the bezel area 920 may be uniformly or regularly disposed, and one or more surplus transistors in a specific row may be electrically connected to one or more light emitting elements in another row through the routing structure 940. Thereby, the display device according to the embodiments described above can have a central area 910 greater than typical display devices.

The embodiments described above will be briefly described as follows.

The display device 100 according to aspects of the present disclosure may include the display area DA, one or more light emitting elements ED, one or more transistors 1050, and the routing structure 940.

The display area DA may include the first optical area OA1 and the normal area NA. The first optical area OA1 may include the central area 910 and the bezel area 920 located outside of the central area 910. The first optical area OA1 may include a plurality of rows including the first row R1 and the second row R2.

The light emitting elements ED may be located in the central area 910 and located in the first row R1.

The transistors 1050 may be located in the bezel area 920 and located in the second row R2.

The routing structure 940 may electrically connect between light emitting elements ED located in the central area 910 and located in the first row R1 and transistors 1050 located in the bezel area 920 and located in the second row R2.

The first optical area OA1 may include a plurality of light emitting elements ED located in the central area 910 and the bezel area 920.

The first optical area OA1 may include a plurality of transistors 1050 located in the bezel area 920.

A transistor 1050 may not be located in the central area 910.

The display device 100 may include a first common electrode CE1. The first common electrode CE1 may serve as an element of a plurality of light emitting elements disposed in the central area 910.

The first common electrode may include one or more first portions corresponding to one or more light emitting areas located in the central area 910, one or more second portions connecting the one or more first portions, and one or more openings located between the one or more first portions and the one or more second portions.

The display device 100 may include a light shield layer LS located in the central area 910 and corresponding to one or more light emitting areas.

The central area 910 may include a plurality of light emitting elements ED. The number of light emitting elements ED included in the first row R1 of the central area 910 may be greater than the number of light emitting elements ED included in the second row R2 of the central area 910.

The number of pixels per unit area disposed in the entire area of the central area 910 may be substantially equal. A size or area of a portion of the central area 910 overlapping the first row R1 may be substantially greater than a size or area of a portion of the central area 910 overlapping the second row R2.

The bezel area 920 may include a plurality of transistors 1050. The number of transistors 1050 included in the first row R1 of the bezel area 920 may be substantially the same as the number of transistors 1050 included in the second row R2 of the bezel area 920.

The number of transistors 1050 per unit area disposed in the entire area of the bezel area 920 may be substantially equal. A size or area of a portion of the bezel area 920 overlapping the first row R1 may be substantially the same as a size or area of a portion of the bezel area 920 overlapping the second row R2.

The display device having the foregoing structure according to aspects of the present disclosure will be discussed in detail below.

Figure 11:
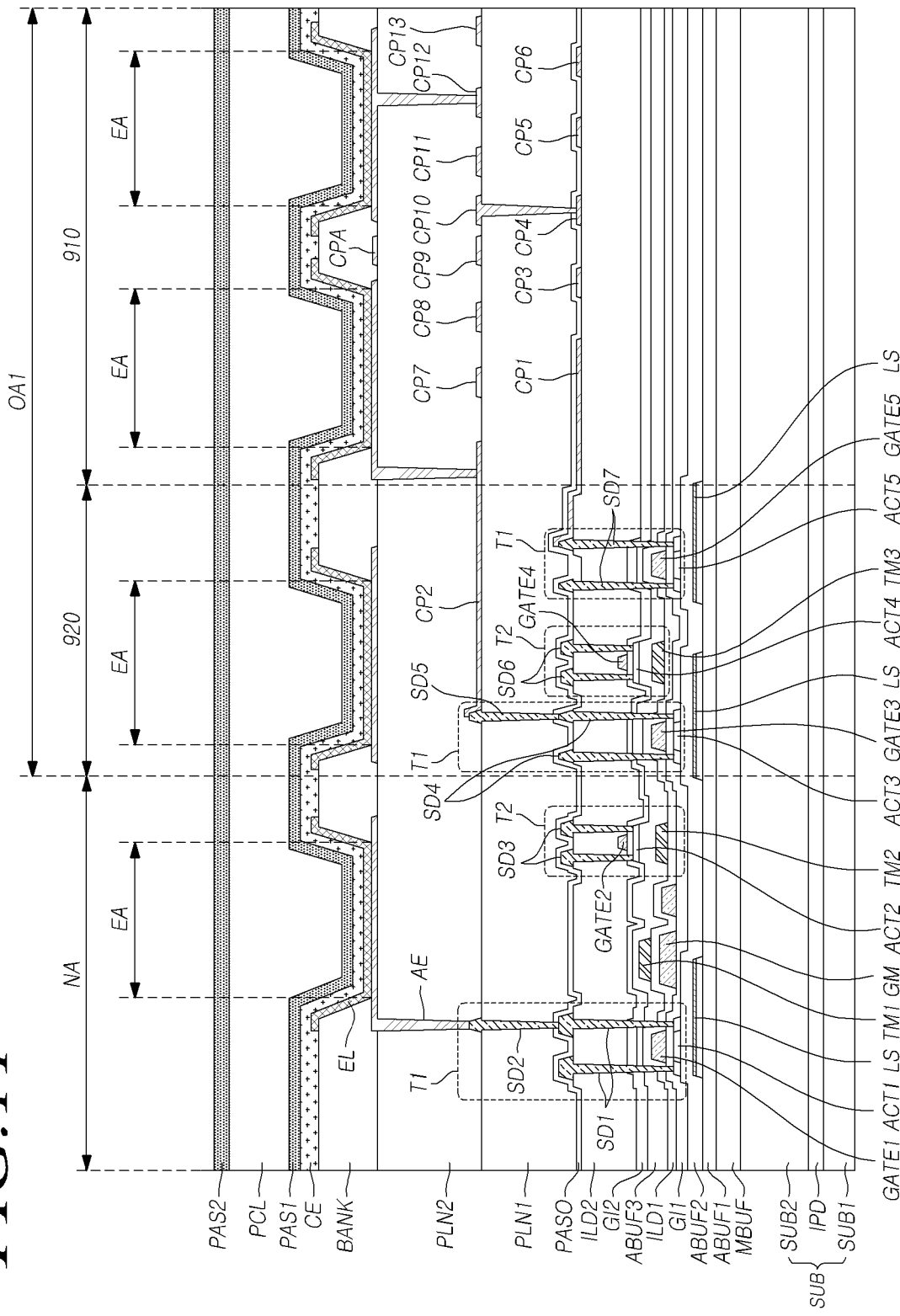
FIGS. 11 and 12 illustrate an example normal area and an example first optical area of the display area of the display device having a routing structure according to various aspects of the present disclosure.
Figure 12:
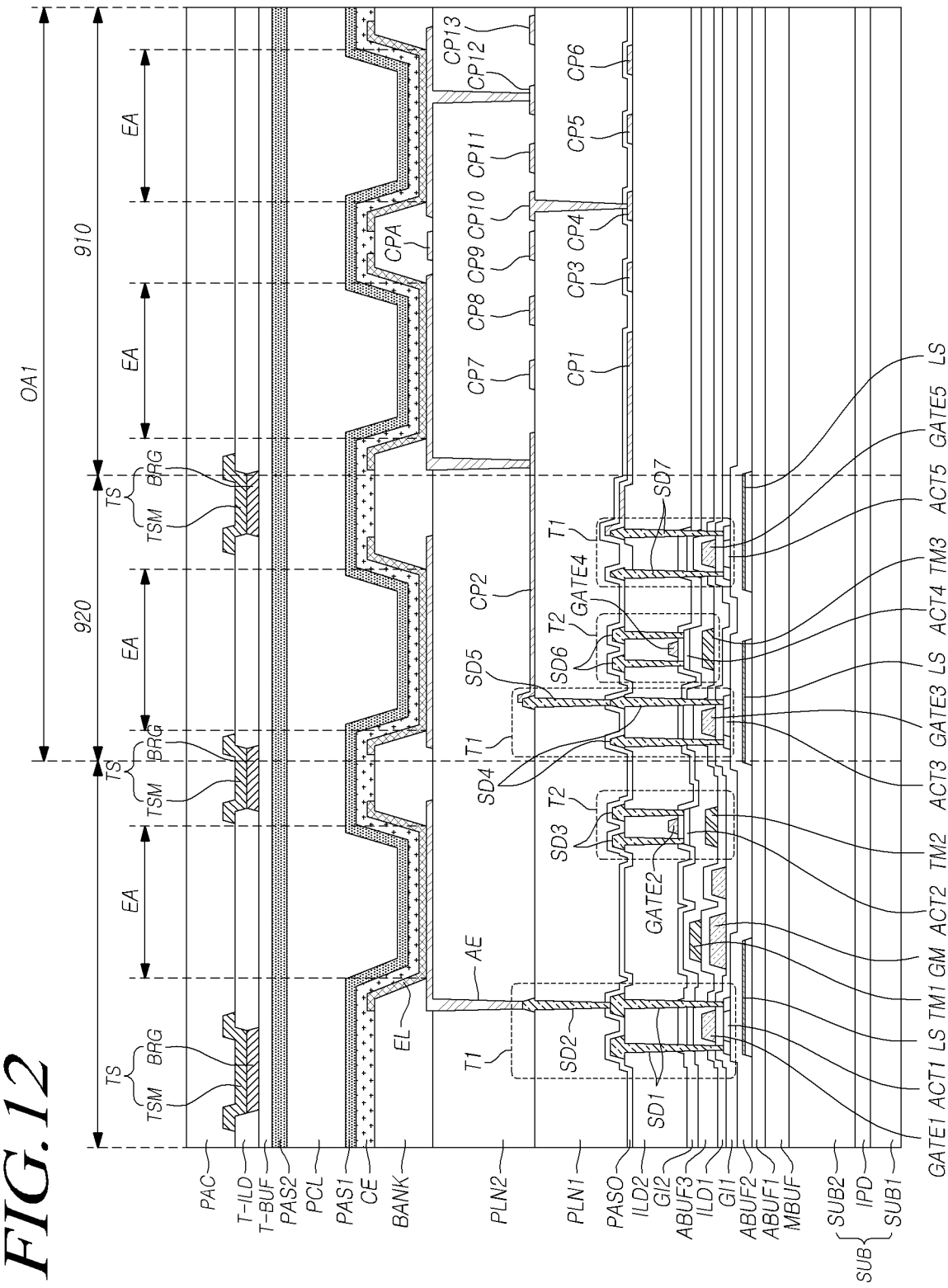

FIGS. 11 and 12 illustrate an example normal area (e.g., the normal area NA in figures discussed above) and an example first optical area (e.g., the first optical area OA1 in figures discussed above) in the display area DA of the display device having a routing structure (e.g., the routing structure 940 in figures discussed above) according to aspects of the present disclosure.

The routing structures of FIGS. 11 and 12 may be implemented using a plurality of connection patterns.

FIG. 11 is an example cross-sectional view of the display panel PNL in an example where a touch sensor is included outside of the display panel PNL in the form of a touch panel. FIG. 12 is an example cross-sectional view of the display panel PNL in an example where a touch sensor TS is included inside of the display panel PNL.

FIGS. 11 and 12 are diagrams illustrating cross-sectional structures of the normal area and a central area (e.g., the central area 910 in figures discussed above) and a bezel area (e.g., the bezel area 920 in figures discussed above) in the first optical area included in the display area DA of the display panel PNL.

Referring to FIGS. 11 and 12, a stack-up configuration of the normal area NA will be described. Stack-up configurations of the normal area NA of FIGS. 11 and 12 may be similar to the stack-up configurations of the normal area NA shown in FIGS. 6 and 7.

Comparing with the configurations of the normal area NA of FIGS. 6 and 7, FIGS. 11 and 12 illustrate that a plurality of transistors may be disposed in at least one subpixel of the normal area NA.

For example, a plurality of transistors T1 and T2 may be disposed in at least one subpixel of the normal area NA. In this example, the plurality of transistors may include a first transistor T1 and a second transistor T2. The first transistor T1 may be a driving transistor, and the second transistor T2 may be a scan transistor. Types and structures of transistors according to embodiments of the present disclosure are not limited thereto. For example, the first transistor T1 may be a scan transistor, the second transistor T2 may be a driving transistor, and the first and second transistors (T1, T2) may be the same type of thin film transistors.

FIGS. 11 and 12 illustrate a structure in which two transistors are disposed in the normal area NA, but embodiments of the present disclosure are not limited thereto. For example, at least two or more transistors may be provided in a subpixel of the normal area NA.

Referring to FIGS. 11 and 12, a substrate SUB may include a first substrate SUB1, an interlayer insulating layer IPD, and a second substrate SUB2.

Various types of patterns (ACT1, SD1, and/or GATE1) for disposing one or more transistors such as the first transistor T1, and the like, various types of insulating layers (MBUF, ABUF1, ABUF2, GI, ILD1, ILD2, and/or PAS0), and various types of metal patterns (TM1, GM, ML1, and/or ML2) may be disposed on or over the substrate SUB.

In an embodiment, various types of patterns (ACT1, GATE1, SD3, and/or SD4) included in the second transistor T2 may be disposed on the substrate SUB.

Referring to FIGS. 11 and 12, a second metal pattern TM2 may be disposed on a first interlayer insulating layer ILD1.

A third active buffer layer ABUF3 may be disposed on the second metal pattern TM2.

A second active layer ACT2 of the second transistor T2 may be disposed on the third active buffer layer ABUF3.

In an embodiment, the first active layer ACT1 of the first transistor T1 and the second active layer ACT2 of the second transistor T2 may be different types of transistors.

For example, the first active layer ACT1 may include a polysilicon material, and the second active layer ACT2 may include a metal oxide material. In this example, the first transistor T1 may be a thin film transistor using low temperature poly-silicon semiconductor LTPS, and the second transistor T2 may be an oxide semiconductor thin film transistor. The active layers of the various transistors include respective source and drain regions.

However, types of transistors according to embodiments of the present disclosure are not limited thereto.

In an embodiment, the first active layer ACT1 of the first transistor T1 and the second active layer ACT2 of the second transistor T2 may be of the same type.

For example, each of the first active layer ACT1 and the second active layer ACT2 may include a metal oxide material or a polysilicon material.

The layer ILD2 may be an interlevel dielectric layer, namely, electrically insulating layer overlying the plurality of transistors, such as T1, T2 and others. This layer ILD2 is a planarizing layer in one embodiment having a planar top surface. A plurality of source-drain regions electrode patterns including SD1, SD3 etc. are overlying the plurality of transistors disposed in the bezel area. Each of these source drain electrode patterns have a first portion extending through the electrically insulating layer and contacting the respective source-drain regions of the respective transistor which they overlay and a second portion overlying and in contact with the top surface of the electrically insulating layer ILD2. These electrode patterns include a first conductive metal that is highly conductive, examples of which include one or more of aluminum (Al), gold (Au), silver (Ag), copper (Cu), tungsten (W), molybdenum (Mo), chromium (Cr), tantalum (Ta), or titanium (Ti) and alloys thereof. These metals are of thickness that they are opaque to light. A first connection pattern is also overlaying and in contact with the top surface of the electrical insulating layer IDL2. At least one of these patterns, CP1 is also overlying and in contact with at least one of the plurality of source-drain electrode patterns in the bezel area. The connection pattern includes a second conductive metal that is different from the first conductive metal. For example, it may include any one of indium tin oxide (ITO), indium zinc oxide (IZO), and indium gallium zinc oxide (IGZO); however, embodiments of the present disclosure are not limited thereto. In one embodiment, all of the connection patterns are transparent conductors or at least semi-transparent to light.

A second gate insulating layer GI2 may be disposed on the second active layer ACT2.

A second gate electrode GATE2 of the second transistor T2 may be disposed on the second gate insulating layer GI2.

A second interlayer insulating layer ILD2 may be disposed on the second gate electrode GATE2.

Two third source-drain electrode patterns SD3s may be disposed on and also extending through the second interlayer insulating layer ILD2.

A portion of the second active layer ACT2 overlapping the second gate electrode GATE2 may serve as a channel region.

One of the two third source-drain electrode patterns SD3s may be connected to a first portion (e.g., a first side portion) of the second active layer ACT2, and the other of the two third source-drain electrode patterns SD3 may be connected to a second portion (e.g., a second side portion) of the second active layer ACT2.

Referring to FIGS. 11 and 12, the second active layer ACT2 may overlap the second metal pattern TM2. In an embodiment, the second metal pattern TM2 may overlap the channel region of the second active layer ACT2, and thus, serve to shield light incident on the second active layer ACT2.

A passivation layer PAS0 may be disposed on one or more first source-drain electrode patterns SD1 (as discussed with reference to FIGS. 6 and 7) and the one or more third source-drain electrode patterns SD3.

Stack-up configurations disposed on the passivation layers PAS0 in the normal areas NA in FIGS. 11 and 12 may be the same as the stack-up configurations of FIGS. 6 and 7, respectively.

For example, a stack-up configuration of the passivation layer PAS0, a first planarization layer PLN1, a second planarization layer PLN2, a second source-drain electrode pattern SD2, an anode electrode AE, a bank BANK, an emission layer EL, a cathode electrode CE, and an encapsulation layer ENCAP, which are illustrated in FIG. 11, may be the same as the stack-up configuration of the passivation layer PAS0, the first planarization layer PLN1, the second planarization layer PLN2, the second source-drain electrode pattern SD2, the anode electrode AE, the bank BANK, the emission layer EL, the cathode electrode CE, and the encapsulation layer ENCAP, which are illustrated in FIG. 6.

For example, a stack-up configuration of the passivation layer PAS0, a first planarization layer PLN1, a second planarization layer PLN2, a second source-drain electrode pattern SD2, an anode electrode AE, a bank BANK, an emission layer EL, a cathode electrode CE, an encapsulation layer ENCAP, a touch buffer layer T-BUF, a touch sensor TS, a touch interlayer insulating layer T-ILD, and a protective layer PAC, which are illustrated in FIG. 12, may be the same as the stack-up configuration of the passivation layer PAS0, the first planarization layer PLN1, the second planarization layer PLN2, the second source-drain electrode pattern SD2, the anode electrode AE, the bank BANK, the emission layer EL, the cathode electrode CE, the encapsulation layer ENCAP, the touch buffer layer T-BUF, the touch sensor TS, the touch interlayer insulating layer T-ILD, and the protective layer PAC, which are illustrated in FIG. 7.

Although FIGS. 11 and 12 illustrate a configuration in which the second planarization layer PLN2 is disposed on the first planarization layer PLN1 in the normal area NA and the first optical area OA1, in an embodiment, unlike the stack-up configurations of the normal area NA and the first optical area OA1, one planarization layer may be disposed in the non-display area NDA (as in FIG. 2) of the display panel PNL according to aspects of the present disclosure.

Next, stack-up configurations of the central area 910 and the bezel area 920 of the first optical area OA1 will be described in detail with reference to FIGS. 11 and 12.

Referring to FIGS. 11 and 12, a plurality of transistors may be disposed in the bezel area 920 of the first optical area OA1, and a transistor may not be disposed in the central area 910.

For example, a plurality of first transistors T1 and a plurality of second transistors T2 may be disposed in the bezel area 920.

Various types of patterns (ACT3, SD4, SD5, GATE3, ACT5, SD7, and/or GATE5) of the plurality of first transistors T1 disposed in the bezel area 920 may be disposed in the same layers as various types of patterns (ACT1, SD1, and/or GATE1) of first transistors disposed in the normal area NA.

For example, a first active layer ACT1 of the normal area NA may be disposed in the same layer as a third active layer ACT3 and a fifth active layer ACT5 of the bezel area 920.

A first gate electrode GATE1 of the normal area NA may be disposed in the same layer as a third gate electrode GATE3 and a fifth gate electrode GATE5 of the bezel area 920.

One or more first source-drain electrode patterns SD1 of the normal area NA may be disposed in the same layer as one or more fourth source-drain electrode patterns SD4 and one or more seventh source-drain electrode patterns SD7 of the bezel area 920.

Various types of patterns (ACT4, SD6, and/or GATE4) of the plurality of second transistors T2 disposed in the bezel area 920 may be disposed in the same layers as various types of patterns (ACT2, SD3, and/or GATE2) of second transistors disposed in the normal area NA.

For example, the second active layer ACT2 of the normal area NA may be disposed in the same layer as a fourth active layer ACT4 of the bezel area 920.

The second gate electrode GATE2 of the normal area NA may be disposed in the same layer as a fourth gate electrode GATE4 of the bezel area 920.

One or more third source-drain electrode patterns SD3 of the normal area NA may be disposed in the same layer as one or more sixth source-drain electrode patterns SD6 of the bezel area 920.

Referring to FIGS. 11 and 12, in an embodiment, one or more seventh source-drain electrode patterns SD7 of each of one or more of the plurality of first transistors T1 disposed in the bezel area 920 may contact a first connection pattern CP1. In an embodiment, one or more fourth source-drain electrode patterns SD4 of each of the remaining one or more of the plurality of first transistors T1 may contact a fifth source-drain electrode pattern SD5.

For example, one of two seventh source-drain electrode patterns SD7 of each of one or more of the plurality of first transistors T1 may contact the first connection pattern CP1.

In an embodiment, the seventh source-drain electrode patterns SD7 may be disposed on the second interlayer insulating layer ILD2, and the first connection pattern CP1 may also be disposed on the second interlayer insulating layer ILD2.

In an embodiment, the one or more seventh source-drain electrode patterns SD7 and the first connection pattern CP1 may directly contact each other on the second interlayer insulating layer ILD2.

For example, as shown in FIGS. 11 and 12, the one or more seventh source-drain electrode patterns SD7 may be disposed on the second interlayer insulating layer ILD2, and the first connection pattern CP1 may be disposed at least in part on the one or more seventh source-drain electrode patterns SD7.

The one or more seventh source-drain electrode patterns SD7 may include an opaque metal. For example, the one or more seventh source-drain electrode patterns SD7 may include any one of a metal such as aluminum (Al), gold (Au), silver (Ag), copper (Cu), tungsten (W), molybdenum (Mo), chromium (Cr), tantalum (Ta), titanium (T1), or the like, and an alloy thereof; however, embodiments of the present disclosure are not limited thereto.

The first connection pattern CP1 may include a transparent conductive material. For example, the first connection pattern CP1 may include any one of indium tin oxide (ITO), indium zinc oxide (IZO), and indium gallium zinc oxide (IGZO); however, embodiments of the present disclosure are not limited thereto.

As shown in FIGS. 11 and 12, the first connection pattern CP1 disposed in the bezel area 920 of the first optical area OA1 may extend up to the central area 910 or a portion of the central area 910.

A plurality of connection patterns (CP3, CP4, CP5, and CP6) may be disposed on the second interlayer insulating layer ILD2 of the central area 910.

Each of the plurality of connection patterns (CP3, CP4, CP5, and CP6) disposed on the second interlayer insulating layer ILD2 may include a transparent conductive material. For example, each of the plurality of connection patterns (CP3, CP4, CP5, and CP6) may include any one of indium tin oxide (ITO), indium zinc oxide (IZO), and indium gallium zinc oxide (IGZO); however, embodiments of the present disclosure are not limited thereto.

In an embodiment, at least one or more of the plurality of connection patterns (CP3, CP4, CP5, and/or CP6) may be electrically connected to one or more seventh source-drain electrode patterns SD7 of one or more first transistors T1 disposed in the bezel area 920 to serve a similar function to the first connection pattern CP1.

In an embodiment, one or more fourth source-drain electrode patterns SD4 of each of the remaining one or more of the plurality of first transistors T1 may contact one or more fifth source-drain electrode patterns SD5.

The one or more fifth source-drain electrode patterns SD5 may be disposed in the same layer as one or more second source-drain electrode patterns SD2 of the normal area NA.

For example, the fifth source-drain electrode pattern SD5 may be disposed on the first planarization layer PLN1 as shown in FIGS. 11 and 12.

The fourth and fifth source-drain electrode patterns SD4 and SD5 disposed in the bezel area 920 of the first optical area OA1 may include an opaque metal. For example, the fourth and fifth source-drain electrode patterns SD4 and SD5 may include any one of a metal such as aluminum (Al), gold (Au), silver (Ag), copper (Cu), tungsten (W), molybdenum (Mo), chromium (Cr), tantalum (Ta), titanium (T1), or the like, and an alloy thereof; however, embodiments of the present disclosure are not limited thereto.

Although FIGS. 11 and 12 illustrate a structure in which the one or more fourth source-drain electrode patterns SD4 and the fifth source-drain electrode pattern SD5 have a single layer; however, embodiments of the present disclosure are not limited thereto.

For example, at least one of the plurality of source-drain electrode patterns disposed in the display panel may include a multilayer stack.

The fifth source-drain electrode pattern SD5 may contact a second connection pattern CP2 disposed on the first planarization layer PLN1.

For example, the fifth source-drain electrode pattern SD5 may be disposed in the same layer as the second connection pattern CP2.

The second connection pattern CP2 may include a transparent conductive material. For example, the second connection pattern CP2 may include any one of indium tin oxide (ITO), indium zinc oxide (IZO), and indium gallium zinc oxide (IGZO); however, embodiments of the present disclosure are not limited thereto.

As shown in FIGS. 11 and 12, the second connection pattern CP2 disposed in the bezel area 920 of the first optical area OA1 may extend up to the central area 910.

A plurality of connection patterns (CP7, CP8, CP9, CP10, CP11, CP12, and CP13) may be disposed on the first planarization layer PLN1 of the central area 910.

Each of the plurality of connection patterns (CP7, CP8, CP9, CP10, CP11, CP12, and CP13) disposed on the first planarization layer PLN1 may include a transparent conductive material. For example, each of the plurality of connection patterns (CP7, CP8, CP9, CP10, CP11, CP12, and CP13) may include any one of indium tin oxide (ITO), indium zinc oxide (IZO), and indium gallium zinc oxide (IGZO); however, embodiments of the present disclosure are not limited thereto.

In an embodiment, one or more of the plurality of connection patterns (CP7, CP8, CP9, CP10, CP11, CP12, and CP13) may be electrically connected to a driving transistor DRT (e.g., the first transistor T1 or the second transistor T2) disposed in the bezel area 920 to serve a similar function to the second connection pattern CP2.

In an embodiment, as shown in FIGS. 11 and 12, at least one of the plurality of connection patterns (CP3, CP4, CP5, and CP6) disposed on the second interlayer insulating layer ILD2 in the central area 910 may contact one of the plurality of connection patterns (CP7, CP8, CP9, CP10, CP11, CP12, and CP13) disposed on the first planarization layer PLN1 through a contact hole formed in the first planarization layer PLN1.

For example, at least one of the plurality of connection patterns (CP7, CP8, CP9, CP10, CP11, CP12, and CP13) disposed on the first planarization layer PLN1 may be electrically connected to one of the plurality of connection patterns (CP3, CP4, CP5, and CP6) disposed on the second interlayer insulating layer ILD2, and therefore, be electrically connected to at least one first transistor T1 disposed in the bezel area 920.

In this example, the plurality of connection patterns (CP7, CP8, CP9, CP10, CP11, CP12, and CP13) disposed on the first planarization layer PLN1 may be electrically connected to one or more first transistors T1 disposed in the bezel area 920 through at least one of the plurality of connection patterns (CP3, CP4, CP5, and CP6) disposed on the second interlayer insulating layer ILD2, or may be electrically connected to one or more fifth source-drain electrode patterns SD5 connected to one or more fourth source-drain electrode patterns SD4 of one or more first transistors T1 in a similar way to serve a similar function to the second connection pattern CP2.

As shown in FIGS. 11 and 12, in an embodiment, one or more seventh source-drain electrode patterns SD7 and a plurality of connection patterns (CP1, CP3, CP4, CP5, and CP6), which include different materials, may be disposed on and/or in a same layer (e.g., on the second interlayer insulating layer ILD2), and the one or more seventh source-drain electrode patterns SD7 may contact at least one of the connection patterns (CP1, CP3, CP4, CP5, and CP6).

In an embodiment, one or more fifth source-drain electrode patterns SD5 and a plurality of connection patterns (CP2, CP7, CP8, CP9, CP10, CP11, CP12, and CP13), which include different materials, may be disposed on and/or in a same layer (e.g., on the first planarization layer PLN1), and the one or more fifth source-drain electrode patterns SD5 may contact at least one of the connection patterns (CP2, CP7, CP8, CP9, CP10, CP11, CP12, and CP13).

For example, as at least one source-drain electrode pattern and at least one connection pattern, which include different materials, are configured to contact each other in the bezel area 920 of the first optical area OA1, the embodiments of the present disclosure can provide advantages of simplifying a corresponding manufacturing process.

In typical implementations, in order to arrange components including different materials to contact each other, an insulating layer may be disposed therebetween, and then, the two components may be arranged to contact each other through a contact hole.

In contrast, in example embodiments of the display device according to aspects of the present disclosure, since at least one source-drain electrode pattern and at least one connection pattern, which include different materials, are arranged to contact each other in a same layer in the bezel area 920 of the first optical area OA1, an insulating layer including a contact hole between the at least one source-drain electrode pattern and the at least one connection pattern can be eliminated, and therefore, the thickness of the display device can be reduced and at least two mask processes can be eliminated.

For example, as an insulating layer disposed between one or more seventh source-drain electrode patterns SD7 and a plurality of connection patterns (CP1, CP3, CP4, CP5, and CP6) can be eliminated, a corresponding thickness can be reduced, and a process (e.g., at least one mask process) of forming a contact hole for contacting the one or more seventh source-drain electrode patterns SD7 and the plurality of connection patterns (CP1, CP3, CP4, CP5, and CP6) can be eliminated.

Further, as an insulating layer disposed between one or more fifth source-drain electrode patterns SD5 and a plurality of connection patterns (CP2, CP7, CP8, CP9, CP10, CP11, CP12, and CP13) can be eliminated, a corresponding thickness can be reduced, and a process (e.g., at least two mask processes) of forming a contact hole for contacting the one or more fifth source-drain electrode patterns SD5 and the plurality of connection patterns (CP2, CP7, CP8, CP9, CP10, CP11, CP12, and CP13) can be eliminated.

Referring to FIGS. 11 and 12, the second planarization layer PLN2 may be disposed on the first planarization layer PLN1.

One or more anode electrodes AE of one or more organic light emitting elements ED such as an organic light emitting diode may be disposed on the second planarization layer PLN2.

The anode electrodes AE may include a transparent conductive material. For example, the anode electrodes AE may include any one of indium tin oxide (ITO), indium zinc oxide (IZO), and indium gallium zinc oxide (IGZO); however, embodiments of the present disclosure are not limited thereto.

Anode electrodes AE disposed in the first optical area OA1 may be electrically connected to one or more first transistors T1 disposed in the bezel area 920 of the first optical area OA1.

Although not shown in the figures, at least one anode electrode AE of at least one light emitting element ED disposed in the bezel area 920 of the first optical area OA1 may be electrically connected to at least one first transistor T1 disposed in the bezel area 920.

Further, at least one anode electrode AE of at least one light emitting element ED disposed in the central area 910 of the first optical area OA1 may be also electrically connected to at least one first transistor T1 disposed in the bezel area 920.

For example, as shown in FIGS. 11 and 12, one or more of anode electrodes AE disposed on the second planarization layer PLN2 in the central area 910 may be electrically connected to one or more connection patterns (e.g., the second connection pattern CP2 or a twelfth connection pattern CP12) disposed on the first planarization layer PLN1 through one or more contact holes. In this example, a connection pattern to which an anode electrode AE is electrically connected may be a connection pattern (e.g., the second connection pattern CP2) that contacts the fifth source-drain electrode pattern SD5 of the first transistor T1 disposed in the bezel area 920.

In an example, one or more of the remaining one or more of the anode electrodes AE may be electrically connected to one (e.g., a tenth connection pattern CP10) of connection patterns disposed on the first planarization layer PLN1 which contacts a connection pattern (e.g., a fourth connection pattern CP4) disposed on the second interlayer insulating layer ILD2. In this example, the fourth connection pattern CP4, which is the connection pattern disposed on the second interlayer insulating layer ILD2, may be a connection pattern that contacts one or more fourth source-drain electrode patterns SD4 of a scan transistor SCT (or a driving transistor DRT) disposed in the bezel area 920.

In this manner, anode electrodes AE disposed in the central area 910 and the bezel area 920 may be electrically connected to one or more driving transistors DRT or one or more scan transistors SCT disposed in the bezel area 920.

In the normal area NA and the first optical area OA1, a bank BANK not overlapping a light emitting area EA may be disposed on the second planarization layer PLN2.

An area where the bank is disposed may be a non-light emitting area.

In an embodiment, an additional connection pattern CPA may be disposed between the second planarization layer PLN2 and the bank BANK in the central area 910.

The additional connection pattern CPA may be disposed in the same layer as at least one anode electrode AE and include the same material as the anode electrode AE. For example, the additional connection pattern CPA may be formed together with the anode electrode AE in the process of forming the anode electrode AE.

In an embodiment, the additional connection pattern CPA may serve to connect at least two anode electrodes AE on the second planarization layer PLN2.

In this embodiment, the anode electrodes AE connected through the additional connection pattern CPA may be anode electrodes AE located in light emitting areas through which light of a substantially same color is emitted.

The additional connection pattern CPA may be electrically connected to one or more of connection patterns (the connection patterns disposed on the second interlayer insulating layer ILD2 or the first planarization layer PLN1) electrically connected to at least one driving transistor DRT or at least one scan transistor SCT disposed in the bezel area 920.

For example, other one or more of the remaining one or more of the anode electrodes AE may be electrically connected to a first transistor T1 disposed in the bezel area 920 through the additional connection pattern CPA disposed on the second planarization layer PLN2.

Although FIGS. 11 and 12 illustrate that the anode electrodes AE of the light emitting elements ED include a single layer stack, embodiments of the present disclosure are not limited thereto.

The anode electrodes AE may include a multilayer stack. For example, the anode electrode AE may include a stack of triple layers, or may include a stack of layers including transparent conductive materials and a reflective electrode interposed therebetween.

As shown in FIGS. 11 and 12, one or more emission layers EL and a cathode electrode CE may be disposed on one or more anode electrodes AE.

An encapsulation layer ENCAP may be disposed on the cathode electrode CE.

In an embodiment, as shown in FIG. 12, a touch buffer layer T-BUF, a touch sensor TS, a touch interlayer insulating layer T-ILD, and a protective layer PAC may be disposed on the encapsulation layer ENCAP.

As shown in FIG. 12, the touch sensor TS may be disposed in the normal area NA and the bezel area 920 of the first optical area OA1, but may not be disposed in the central area 910. However, example configurations of the display device according to aspects of the present disclosure are not limited thereto. For example, a portion of the touch sensor TS or one or more of touch sensors TS may also be disposed in a portion of the central area 910 according to a design requirement.

The touch sensor TS may be disposed in the display panel such that it does not overlap the light emitting area EA.

Although not shown in FIG. 12, a color filter layer may be disposed on the touch sensor TS.

The color filter layer may be disposed to correspond to the light emitting area EA of the normal area NA.

However, example structures of the display device according to aspects of the present disclosure are not limited thereto. For example, the color filter layer may be arranged to correspond to the portion of a light emitting area EA of the first optical area OA1 according to a design requirement. In an example where the color filter layer is disposed in the first optical area OA1, the area, location, and thickness of the color filter layer may be variously determined taking account of the transmittance of the first optical area OA1.

Although the discussions with respect to FIGS. 11 and 12 have been provided focusing on the stack-up configurations of the normal area NA and the first optical area OA1, the second optical area OA2 may also include a stack-up configuration corresponding to the stack-up configuration of the first optical area OA1. Therefore, it should be understood that the scope of the present disclosure includes such configurations of the second optical area OA2 corresponding to the embodiments or examples discussed above with respect to the first optical area OA1.

The display device according to aspects of the present disclosure may include a display panel including the display area DA that includes the first optical area OA1 including the central area 910 and the bezel area 920 located outside of the central area 910, and includes the normal area NA located outside of the first optical area OA1. The display panel may include a plurality of light emitting elements ED disposed in the central area 910, a plurality of light emitting elements ED and a plurality of transistors including a plurality of source-drain electrode patterns (e.g., SD4 and SD5), which are disposed in the bezel area 920, and a plurality of connection patterns (e.g., CP1 and CP2) contacting the source-drain electrode patterns (SD4 and SD5) in the bezel area 920 and extending to a portion of the central area 910. At least one of the plurality of source-drain electrode patterns (e.g., SD4 and SD5) and at least one of the plurality of connection patterns (e.g., CP1 and CP2) may be disposed in a same layer and include different materials.

The plurality of transistors disposed in the bezel area 920 may include a plurality of driving transistors DRT or a plurality of scan transistors SCT. Some of the first transistors T1 may be electrically connected to a plurality of light emitting elements ED disposed in the bezel area 920, and the other of the first transistor T1 may be electrically connected to a plurality of light emitting elements ED disposed in the central area 910.

At least some source-drain electrode patterns (SD4, SD5, and SD7) may include an opaque metal, and at least some connection patterns (CP1 to CP13) may include a transparent conductive material.

The source-drain electrode patterns may include at least one fourth source-drain electrode pattern SD4, at least one fifth source-drain electrode pattern SD5 electrically connected to the at least one fourth source-drain electrode pattern SD4, and at least one seventh source-drain electrode pattern SD7 disposed in a same layer as the at least one fourth source-drain electrode pattern SD4. The connection patterns (CP1 to CP13) may include a plurality of connection patterns (CP3 to CP13) in addition to first and second connection patterns (CP1 and CP2). For example, at least two of the plurality of connection patterns (CP3 to CP13) and the first and second connection patterns (CP1 and CP2) may be disposed in different layers.

The display device may include a first insulating layer ILD2 disposed on a substrate, the at least one seventh source-drain electrode pattern SD7 disposed on the first insulating layer ILD2, and the first connection pattern CP1 disposed in a same layer as the at least one seventh source-drain electrode pattern SD7. The first connection pattern CP1 may contact the at least one seventh source-drain electrode pattern SD7.

The first connection pattern CP1 may contact the top surface of the at least one seventh source-drain electrode pattern SD7. In some embodiments, the first connection pattern CP1 may contact a portion of at least one side surface, or both the top surface and at least one side surface, of the at least one seventh source-drain electrode pattern SD7.

The display device may include a second insulating layer PLN1 disposed on the at least one seventh source-drain electrode pattern SD7 and the first connection pattern CP1, and a plurality of connection patterns (CP7, CP8, and CP9, CP10, CP11, CP12, and CP13) disposed on the second insulating layer PLN1. The first connection pattern CP1 may be electrically connected to at least one of the plurality of connection patterns (CP7, CP8, CP9, CP10, CP11, CP12, and CP13).

The display device may include a third insulating layer PLN2 disposed on the second insulating layer PLN1. At least one connection pattern disposed on the second insulating layer PLN1 and electrically connected to the first connection pattern CP1 may be electrically connected to at least one anode electrode AE of at least one of a plurality of light emitting elements ED disposed on the third insulating layer PLN2 in the central area.

The display device may include connection patterns (CP3, CP4, CP5, and CP6) disposed in a same layer as the first connection pattern CP1 and electrically connected to at least one driving transistor DRT or at least one scan transistor SCT disposed in the bezel area 920. At least one of the connection patterns (CP3, CP4, CP5, and CP6) may be electrically connected to at least one of a plurality of connection patterns (CP7, CP8, CP9, CP10, CP11, CP12, and CP13) disposed on the connection patterns (CP3, CP4, CP5, and CP6). The at least one of the plurality of connection patterns (CP7, CP8, CP9, CP10, CP11, CP12, and CP13) electrically connected to the connection patterns (CP3, CP4, CP5, and CP6) may be connected to at least one of anode electrodes AE of a plurality of light emitting elements ED.

The display device may include the first insulating layer ILD2 disposed on the substrate, the at least one fourth source-drain electrode pattern SD4 disposed on the first insulating layer ILD2, the second insulating layer PLN1 disposed on the least one fourth source-drain electrode pattern SD4, the at least one fifth source-drain electrode pattern SD5 electrically connected to the at least one fourth source-drain electrode pattern SD4, and the second connection pattern CP2 disposed in a same layer as the at least one fifth source-drain electrode pattern SD5. The second connection pattern CP2 may contact the fifth source-drain electrode pattern SD5.

The second connection pattern CP2 may contact the top surface of the fifth source-drain electrode pattern SD5. In some embodiments, the second connection pattern CP2 may contact a portion of at least one side surface, or both the top surface and at least one side surface, of the fifth source-drain electrode pattern SD5.

The display device may include the third insulating layer PLN2 disposed on the fifth source-drain electrode pattern SD5 and the second connection pattern CP2. At least one anode electrode AE of at least one of a plurality of light emitting elements ED disposed on the third insulating layer PLN2 in the central area 910 may be electrically connected to the second connection pattern CP2.

The display device may further include an additional connection pattern CPA disposed in a same layer as one or more anode electrodes AE. The additional connection pattern may be electrically connected to one or more of a plurality of anode electrodes, and may be electrically connected to one or more first transistors T1 disposed in the bezel area through one or more of the connection patterns (CP1 to CP13).

Light emitting areas in which the anode electrodes AE connected through the additional connection pattern CPA are disposed may be configured to emit light of a substantially equal color.

The display panel according to aspects of the present disclosure may include the display area DA that includes the first optical area OA1 including the central area 910 and the bezel area 920 located outside of the central area 910, and includes the normal area NA located outside of the first optical area OA1. The display panel may include a plurality of light emitting elements ED disposed in the central area 910, a plurality of light emitting elements ED and a plurality of transistors including a plurality of source-drain electrode patterns (e.g., SD4, SD5 and SD7), which are disposed in the bezel area 920, and a plurality of connection patterns (e.g., CP1 and CP2) contacting the source-drain electrode patterns (SD4, SD5 and SD7) in the bezel area 920 and extending to a portion of the central area 910. At least one of the plurality of source-drain electrode patterns (e.g., SD4, SD5 and SD7) and at least one of the plurality of connection patterns (e.g., CP1 and CP2) may be disposed in a same layer and include different materials.

According to the one or more example embodiments described herein, a display panel and a display device can be provided that are capable of improving the transmittance of a central area by disposing a plurality of transistors in a bezel area of an optical area while not disposing transistors in the central area of the optical area.

According to the one or more example embodiments described herein, a display panel and a display device can be provided that are capable of reducing thicknesses thereof and simplify a manufacturing process by arranging, in a same layer, at least one source-drain electrode pattern of at least one transistor and at least one connection pattern, which include different materials and are disposed in an optical area.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a display panel having a display area that includes a first optical area having a central area and a bezel area located outside of the central area, the display area also including a normal area located outside of the first optical area; and
   a display driving circuit for driving the display panel, wherein the display panel comprises:
      a plurality of light emitting elements disposed in the central area;
      a plurality of light emitting elements disposed in the bezel area;
   a plurality of transistors each including a respective one of a plurality of source-drain electrode patterns disposed in the bezel area;
   a first connection pattern contacting a first source-drain electrode pattern in the bezel area and extending to a portion of the central area;
   a second insulating layer disposed on the first source-drain electrode pattern and the first connection pattern; and
   a plurality of connection patterns disposed on the second insulating layer,
   wherein the first connection pattern is electrically connected to at least one of the plurality of connection patterns, and
   wherein the first source-drain electrode pattern and the first connection pattern are disposed on a same layer and include different materials.

2. The display device of claim 1, wherein a first set of the plurality of transistors of the bezel area are electrically connected to the plurality of light emitting elements disposed in the bezel area, and
   wherein a second set of the plurality of transistors are electrically connected to the plurality of light emitting elements disposed in the central area.

3. The display device of claim 1, wherein the plurality of source-drain electrode patterns includes an opaque metal, and the first connection pattern includes a transparent conductive material.

4. The display device of claim 1, wherein the plurality of source-drain electrode patterns includes:
   the first source-drain electrode pattern, a second source-drain electrode pattern disposed in a same layer as the first source-drain electrode pattern, and a third source-drain electrode pattern electrically connected to the second source-drain electrode pattern;
   a second connection pattern and
   a third connection pattern,
   wherein at least two of the first, second, third connection patterns are disposed in different layers.

5. The display device of claim 4, wherein the display panel further comprises:
   a first insulating layer disposed over a substrate;
   the second source-drain electrode pattern disposed on the first insulating layer;
   the third source-drain electrode pattern being electrically connected to the second source-drain electrode pattern; and
   the third connection pattern is disposed on a same layer as the third source-drain electrode pattern,
   wherein the third connection pattern contacts the third source-drain electrode pattern.

6. The display device of claim 5, wherein the third connection pattern contacts a top surface of the third source-drain electrode pattern or contacts both the top surface and at least one side surface of the third source-drain electrode pattern.

7. The display device of claim 5, wherein the display panel further comprises:
   a third insulating layer disposed on the third source-drain electrode pattern and the third connection pattern,
   wherein at least one anode electrode of at least one of the plurality of light emitting elements disposed on the third insulating layer in the central area is electrically connected to the third connection pattern.

8. The display device of claim 5, wherein the display panel further comprises:
   a bank disposed on anode electrodes of the plurality of light emitting elements in a location that covers a portion of the anode electrodes; and
   an additional connection pattern disposed between the third insulating layer and the bank in the first optical area,
   wherein the additional connection pattern and at least one anode electrode of the plurality of light emitting elements are disposed in the same layer and include the same material.

9. The display device of claim 1, wherein the display panel further comprises:
   a first insulating layer disposed over a substrate;
   the first source-drain electrode pattern disposed on the first insulating layer; and
   the first connection pattern is disposed on a same layer as the first source-drain electrode pattern,
   wherein the first connection pattern contacts the first source-drain electrode pattern.

10. The display device of claim 9, wherein the first connection pattern contacts both the top surface and at least one side surface of the first source-drain electrode pattern.

11. The display device of claim 1, wherein the first connection pattern contacts a top surface of the first source-drain electrode pattern.

12. The display device of claim 1, wherein the display panel further comprises:
    a third insulating layer disposed on the second insulating layer in the central area and having a first set of the plurality of light emitting elements disposed thereon,
    wherein at least one of the plurality of connection patterns disposed on the second insulating layer and electrically connected to the first connection pattern is electrically connected to at least one anode electrode of at least one of the plurality of light emitting elements disposed on the third insulating layer in the central area.

13. The display device of claim 1, wherein the display panel further comprises:
    a plurality of anode electrodes; and
    an additional connection pattern disposed on a same layer as at least one of the plurality of anode electrodes,
    wherein the additional connection pattern is electrically connected to the plurality of anode electrodes, and is electrically connected to a transistor disposed in the bezel area through the first connection pattern.

14. The display device of claim 13, wherein light emitting areas in which the plurality of anode electrodes connected through the additional connection pattern are disposed are configured to emit light of a substantially equal color.

15. The display device of claim 1, further comprising:
a first optical electronic device located in a lower portion of, the display panel and overlapping at least a portion of the first optical area included in the display area.

16. The display device of claim 1, wherein the display area further includes a second optical area different from the first optical area and the normal area, and the display device further comprises:
a second optical electronic device that is located in a lower portion of, the display panel and overlaps at least a portion of the second optical area,
wherein a portion of the normal area is disposed between the first optical area and the second optical area.

17. The display device of claim 1, wherein the display panel further comprises:
an encapsulation layer disposed on the plurality of emitting elements;
a touch buffer layer disposed on the encapsulation layer; and
a touch sensor disposed on the touch buffer layer.

18. The display device of claim 17, wherein the encapsulation layer includes a first encapsulation layer, a second encapsulation layer, and a third encapsulation layer which are sequentially stacked, wherein a thickness of the second encapsulation layer is greater than a thickness of the first encapsulation layer.

19. The display device of claim 17, wherein the touch sensor includes touch sensor metals and a bridge metal located on different layers, and wherein a touch interlayer insulation layer is disposed between the touch sensor metals and the bridge metal.

20. The display device of claim 19, wherein the touch sensor metals include a first touch sensor metal, a second touch sensor metal, and a third touch sensor metal disposed adjacent to each other, the third touch sensor metal is present between the first touch sensor metal and the second touch sensor metal, the first touch sensor metal and the second touch sensor metal are electrically connected to each other through the bridge metal located on a different layer, and the bridge metal is insulated from the third touch sensor metal by the touch interlayer insulating layer.

21. The display device of claim 19, wherein an area of the touch sensor metals per unit area in the first optical area is smaller than an area of the touch sensor metals per unit area in the normal area.

22. The display device of claim 1, wherein the first optical area includes one or more light emitting areas and one or more first transmission areas,
wherein material layers having electrical conductive properties are not disposed in the first transmission areas.

23. A display panel comprising:
a display area having a first optical area that includes a central area and a bezel area located outside of the central area, the display area also including a normal area located outside of the first optical area, the display panel comprising:
a plurality of light emitting elements disposed in the central area;
a plurality of light emitting elements disposed in the bezel area;
a plurality of transistors are disposed in the bezel area; and
an electrically insulating layer overlying the plurality of transistors, the electrically insulating layer having a top surface;
a first plurality of source-drain electrode patterns overlying the plurality of transistors disposed in the bezel area and having a first portion extending through the electrically insulating layer and contacting the respective source-drain regions of the respective transistors and a second portion overlying and in contact with the top surface of the electrically insulating layer;
at least one connection pattern contacting at least one of the plurality of source-drain electrode patterns in the bezel area and extending to a portion of the central area,
a planarization layer overlying the at least one connection pattern; and
a second plurality of source-drain electrode patterns overlying at least one of the first plurality of source-drain electrode patterns that are overlying the plurality of transistors disposed in the bezel area, a second source-drain electrode pattern having a first portion extending through the planarization layer and contacting the respective source-drain electrode it overlies and a second portion overlying and in contact with the top surface of the planarization layer.

24. The display panel of claim 23, wherein the first optical area includes one or more light emitting areas and one or more first transmission areas, and material layers having electrical conductive properties are not disposed in the first transmission areas.

25. The display panel of claim 24 further including:
a second connection pattern overlaying and in contact with the top surface of the planarization layer and also overlying and in contact with the second source-drain electrode pattern.

26. A display panel comprising:
a display area having a first optical area that includes a central area and a bezel area located outside of the central area, the display area also including a normal area located outside of the first optical area, the display panel comprising:
a plurality of light emitting elements disposed in the central area;
a plurality of light emitting elements disposed in the bezel area;
a plurality of transistors disposed in the bezel area, each transistor including a semiconductor active area having source-drain regions therein;
an electrically insulating layer overlying the plurality of transistors, the electrically insulating layer having a top surface;
a plurality of source-drain electrode patterns overlying the plurality of transistors disposed in the bezel area and having a first portion extending through the electrically insulating layer and contacting the respective source-drain regions of the respective transistors and a second portion overlying and in contact with the top surface of the electrically insulating layer, the electrode patterns including a first conductive metal;
a first connection pattern overlaying and in contact with the electrical insulating layers and also overlying and in contact with at least one of the plurality of source-drain electrode patterns in the bezel area, the connection pattern including a second conductive metal that is different from the first conductive metal.

27. The display panel of claim 26 wherein the electrically insulating layer is a planarization layer having the top surface thereof is planar.

28. The display panel of claim 26 further including:
a planarization layer overlying the electrically insulating layer, the planarization layer being an electrical insulator and having the top surface thereof is planar.

* * * * *